(12) United States Patent
Laven et al.

(10) Patent No.: US 10,403,556 B2
(45) Date of Patent: Sep. 3, 2019

(54) SEMICONDUCTOR DEVICE INCLUDING A HEAT SINK STRUCTURE

(71) Applicant: Infineon Technologies AG, Neubiberg (DE)

(72) Inventors: Johannes Georg Laven, Taufkirchen (DE); Peter Irsigler, Obernberg/Inn (AT); Joachim Mahler, Regensburg (DE); Guenther Ruhl, Regensburg (DE); Hans-Joachim Schulze, Taufkirchen (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 15/381,155

(22) Filed: Dec. 16, 2016

(65) Prior Publication Data

US 2017/0186663 A1 Jun. 29, 2017

(30) Foreign Application Priority Data

Dec. 23, 2015 (DE) .................. 10 2015 122 804

(51) Int. Cl.
| | |
|---|---|
| *B82Y 30/00* | (2011.01) |
| *H01L 29/06* | (2006.01) |
| *H01L 29/08* | (2006.01) |
| *H01L 29/10* | (2006.01) |

(Continued)

(52) U.S. Cl.
CPC ...... *H01L 23/3672* (2013.01); *H01L 23/3677* (2013.01); *H01L 23/373* (2013.01); *H01L 23/3737* (2013.01); *H01L 23/4275* (2013.01); *H01L 29/0649* (2013.01); *H01L 29/0657* (2013.01); *H01L 29/1095* (2013.01); *H01L 29/404* (2013.01); *H01L 29/405* (2013.01); *H01L 29/407* (2013.01); *H01L 29/41766* (2013.01); *H01L 29/4236* (2013.01); *H01L 29/4238* (2013.01); *H01L 29/7397* (2013.01);

(Continued)

(58) Field of Classification Search
CPC . H01L 23/3738; H01L 29/405; H01L 29/407; H01L 29/7813; H01L 29/66734
See application file for complete search history.

(56) References Cited

U.S. PATENT DOCUMENTS

| | | |
|---|---|---|
| 2003/0209802 A1 | 11/2003 | Awano |
| 2008/0164516 A1 | 7/2008 | Darwish |

(Continued)

FOREIGN PATENT DOCUMENTS

| | | |
|---|---|---|
| DE | 102012100349 A1 | 7/2012 |
| DE | 102014100522 A1 | 7/2014 |
| JP | 2006303145 A | 11/2006 |

*Primary Examiner* — Phat X Cao
*Assistant Examiner* — Diana C Vieira
(74) *Attorney, Agent, or Firm* — Murphy, Bilak & Homiller, PLLC

(57) ABSTRACT

A semiconductor device includes a drift structure formed in a semiconductor body. The drift structure forms a first pn junction with a body zone of a transistor cell. A gate structure extends from a first surface of the semiconductor body into the drift structure. A heat sink structure extends from the first surface into the drift structure. A thermal conductivity of the heat sink structure is greater than a thermal conductivity of the gate structure and/or a thermal capacity of the heat sink structure is greater than a thermal capacity of the gate structure.

23 Claims, 27 Drawing Sheets

(51) Int. Cl.
  *H01L 29/40*   (2006.01)
  *H01L 29/78*   (2006.01)
  *H01L 23/367*  (2006.01)
  *H01L 23/373*  (2006.01)
  *H01L 23/427*  (2006.01)
  *H01L 29/417*  (2006.01)
  *H01L 29/423*  (2006.01)
  *H01L 29/739*  (2006.01)

(52) U.S. Cl.
  CPC .......... *H01L 29/7813* (2013.01); *B82Y 30/00* (2013.01); *H01L 29/0696* (2013.01); *H01L 29/0834* (2013.01); *H01L 29/0878* (2013.01); *Y10S 977/742* (2013.01); *Y10S 977/753* (2013.01)

(56) References Cited

U.S. PATENT DOCUMENTS

| | | | |
|---|---|---|---|
| 2013/0093073 A1* | 4/2013 | Chen | H01L 23/36 257/686 |
| 2013/0127037 A1* | 5/2013 | Mori | H01L 23/3677 257/712 |
| 2013/0292161 A1* | 11/2013 | Liu | C25D 5/022 174/257 |
| 2014/0183699 A1 | 7/2014 | Dahlstrom | |
| 2015/0187678 A1* | 7/2015 | Park | H01L 23/367 257/712 |
| 2016/0126381 A1* | 5/2016 | Wang | H01L 31/035227 257/429 |
| 2016/0268181 A1* | 9/2016 | Yasuhara | H01L 29/51 |

\* cited by examiner

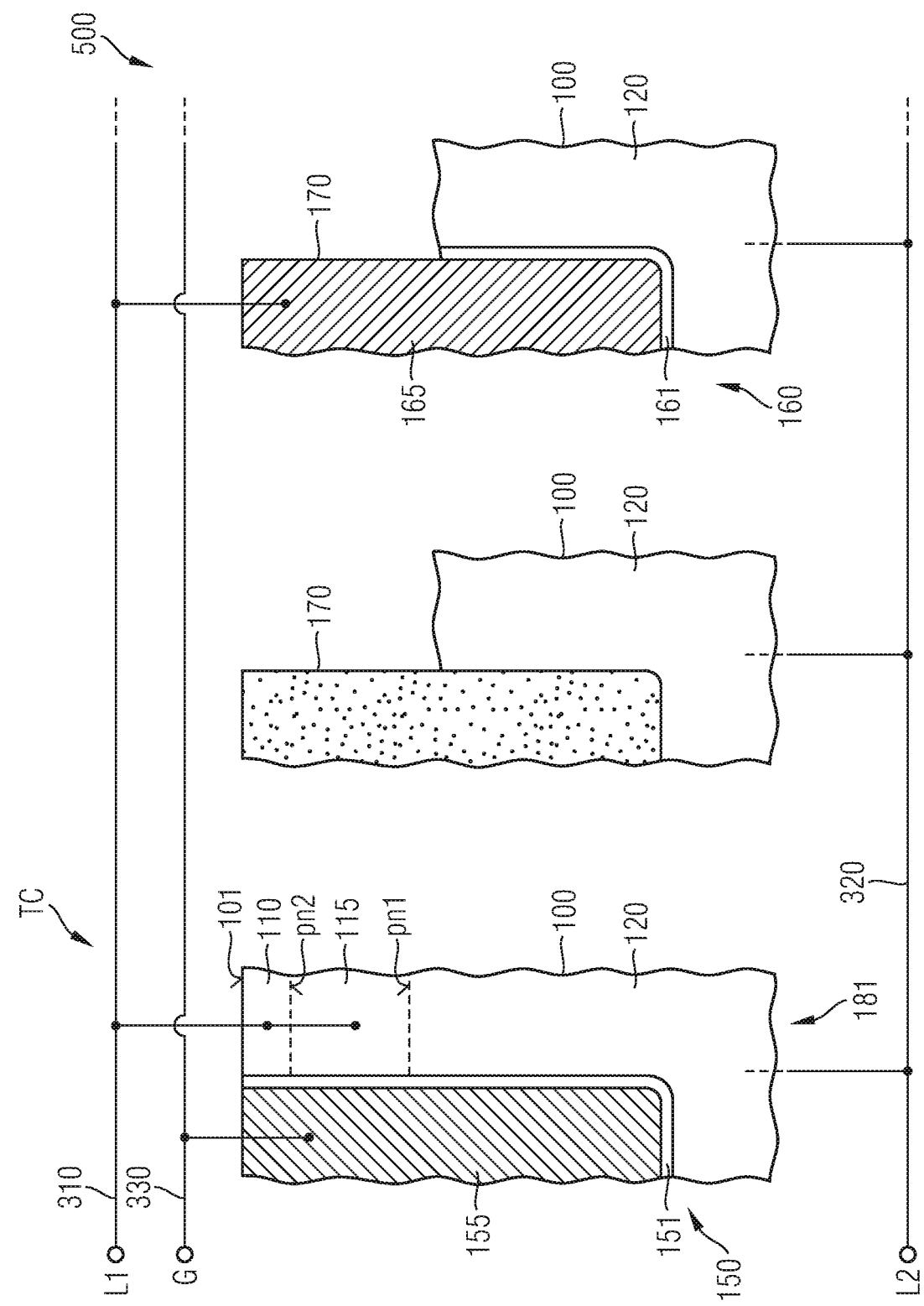

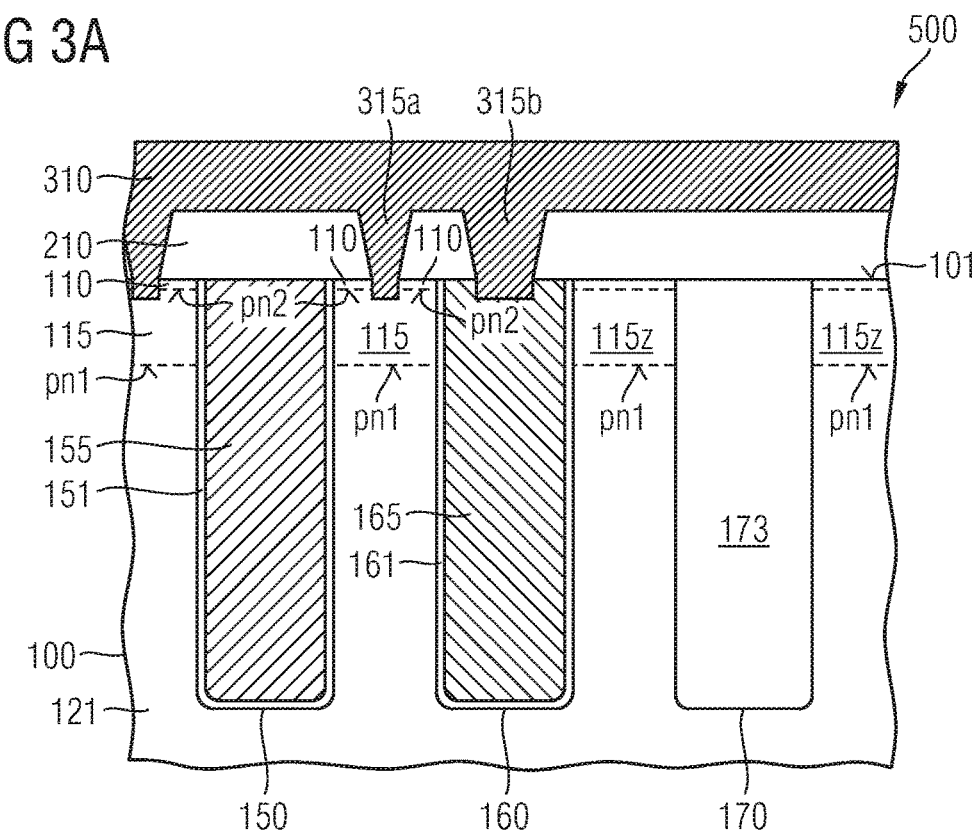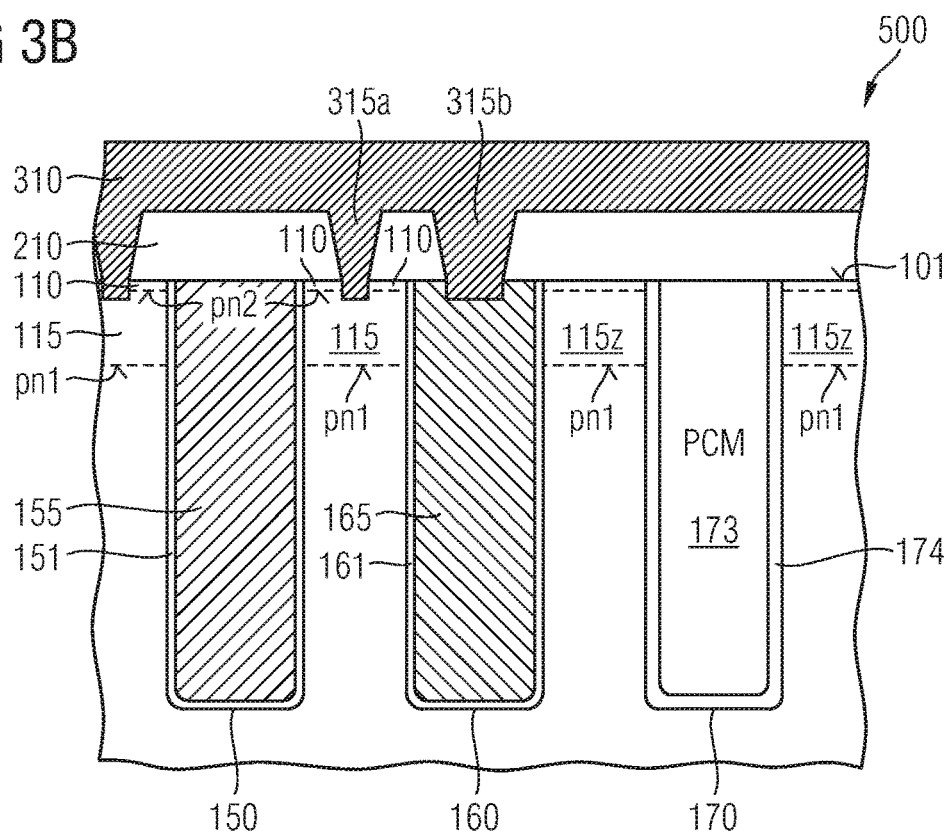

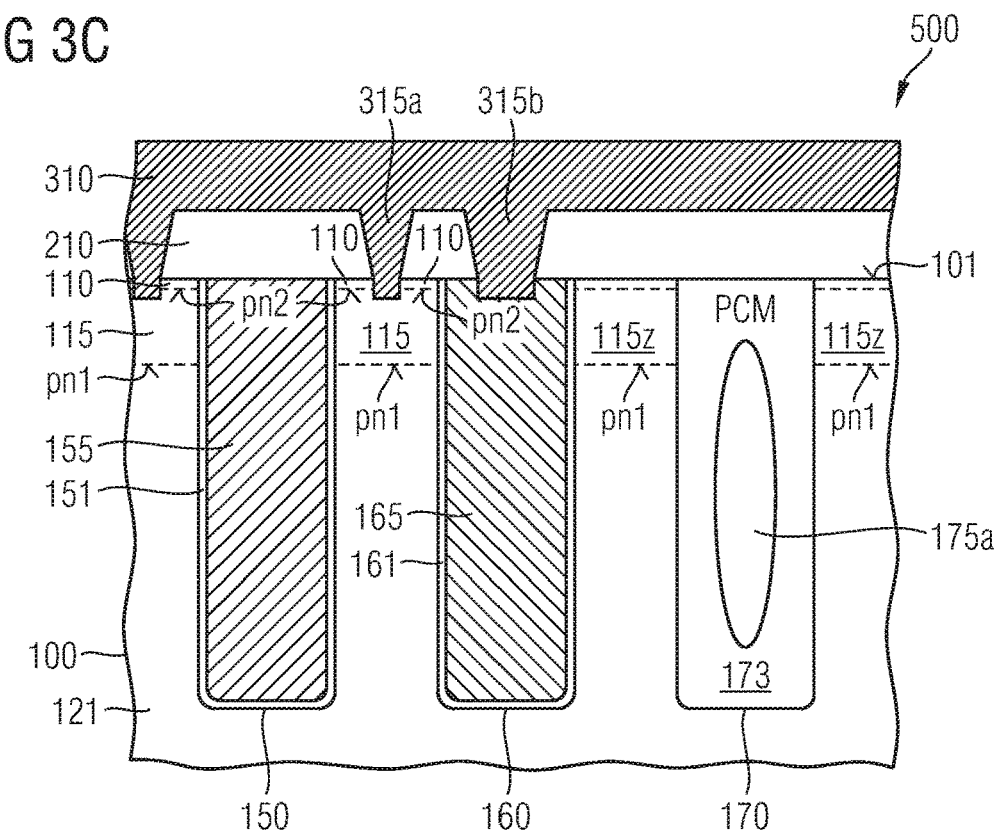
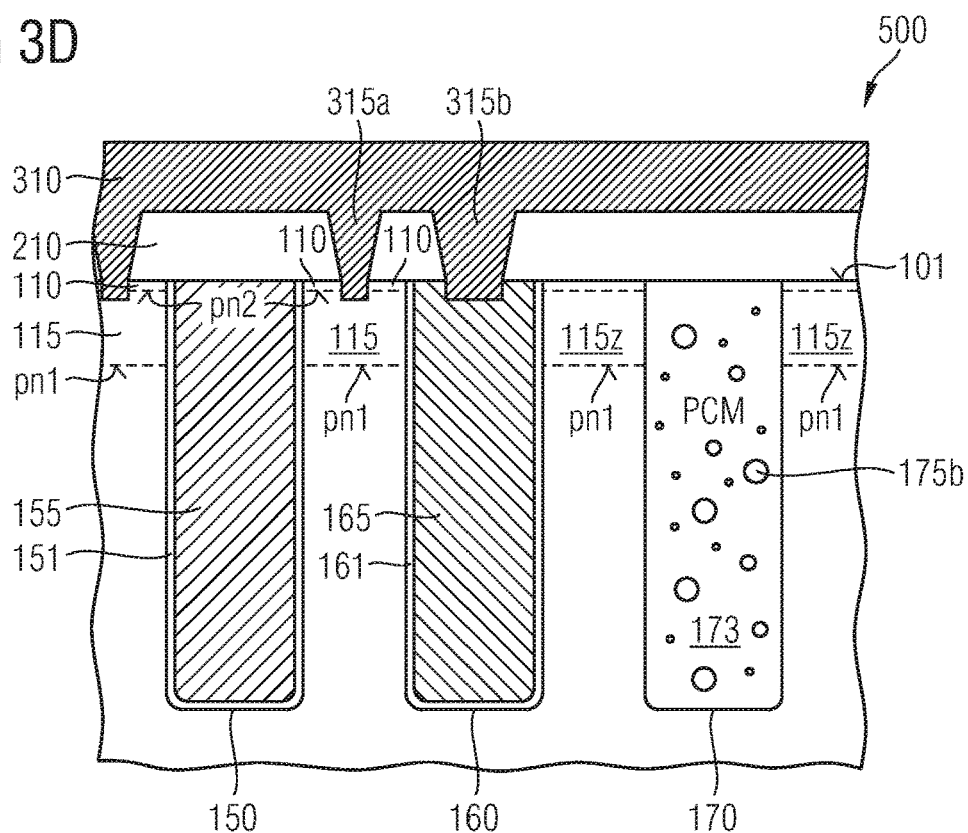

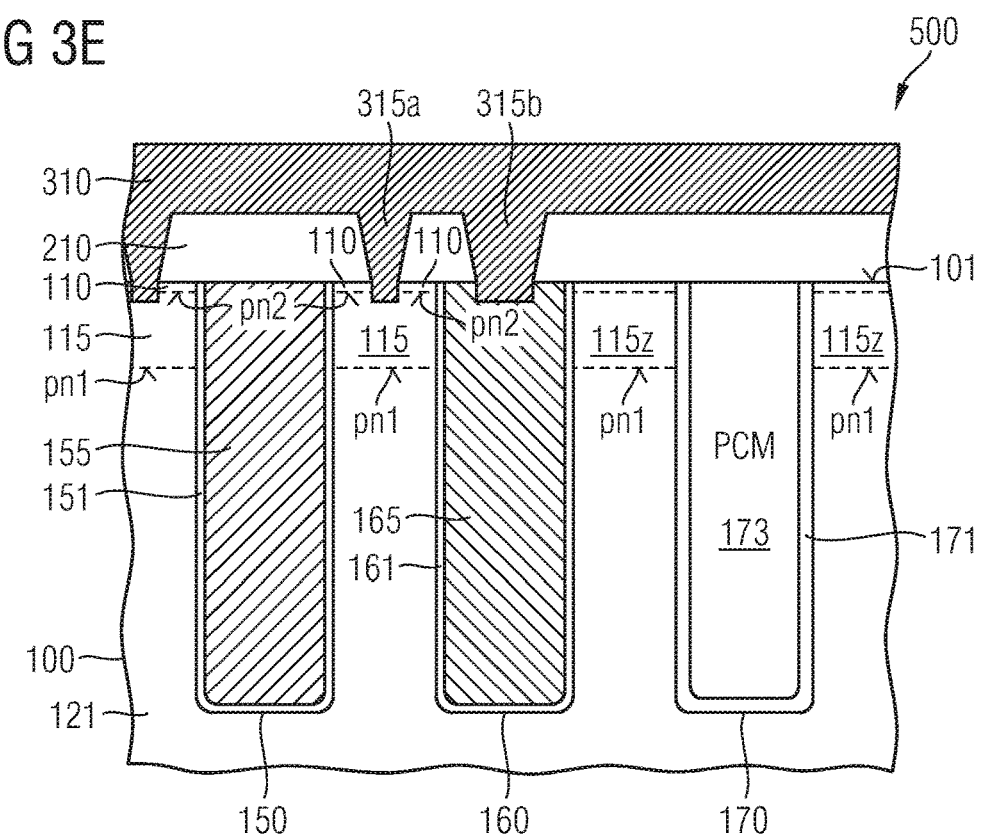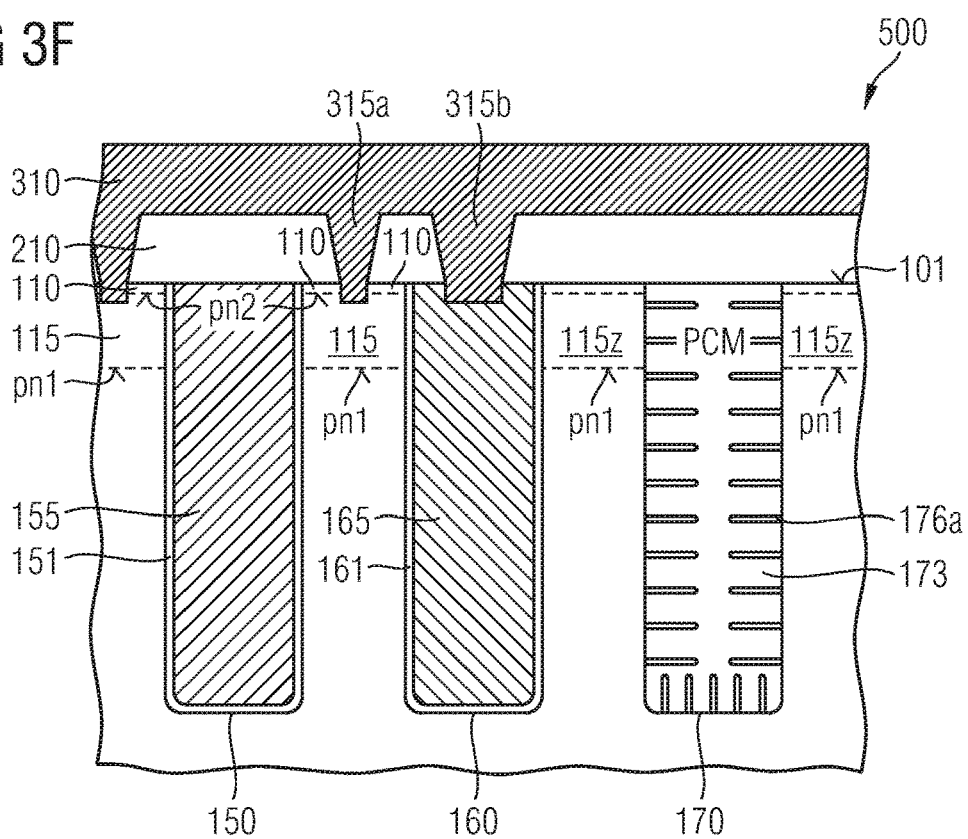

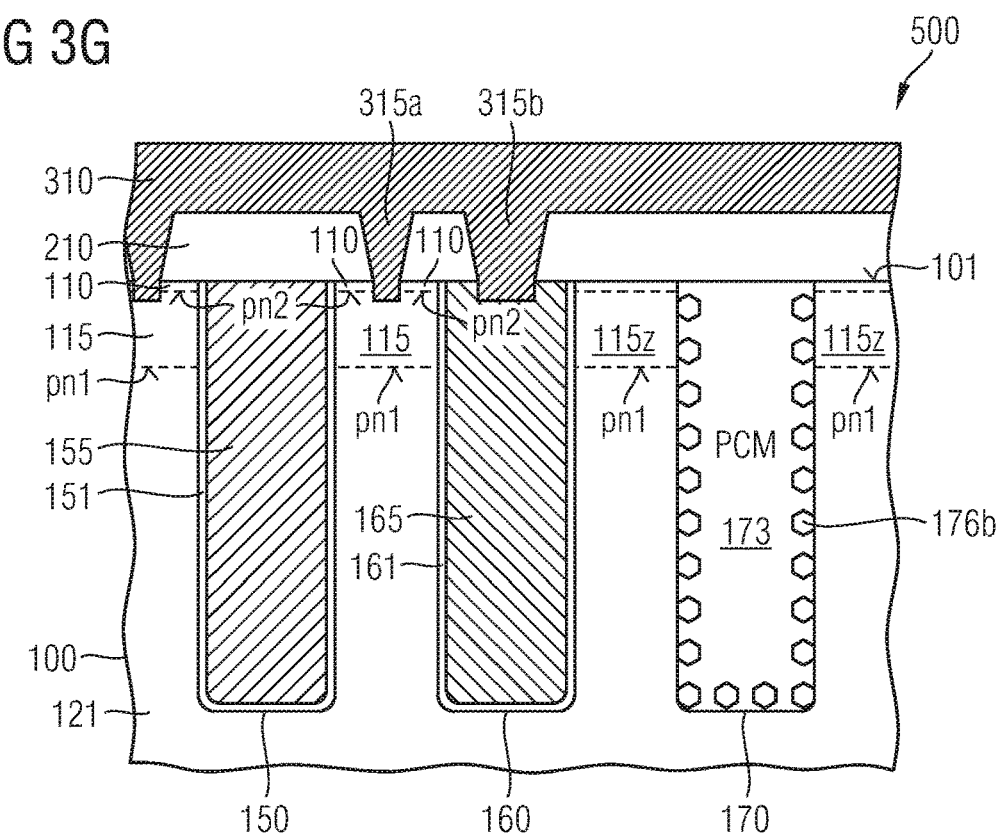
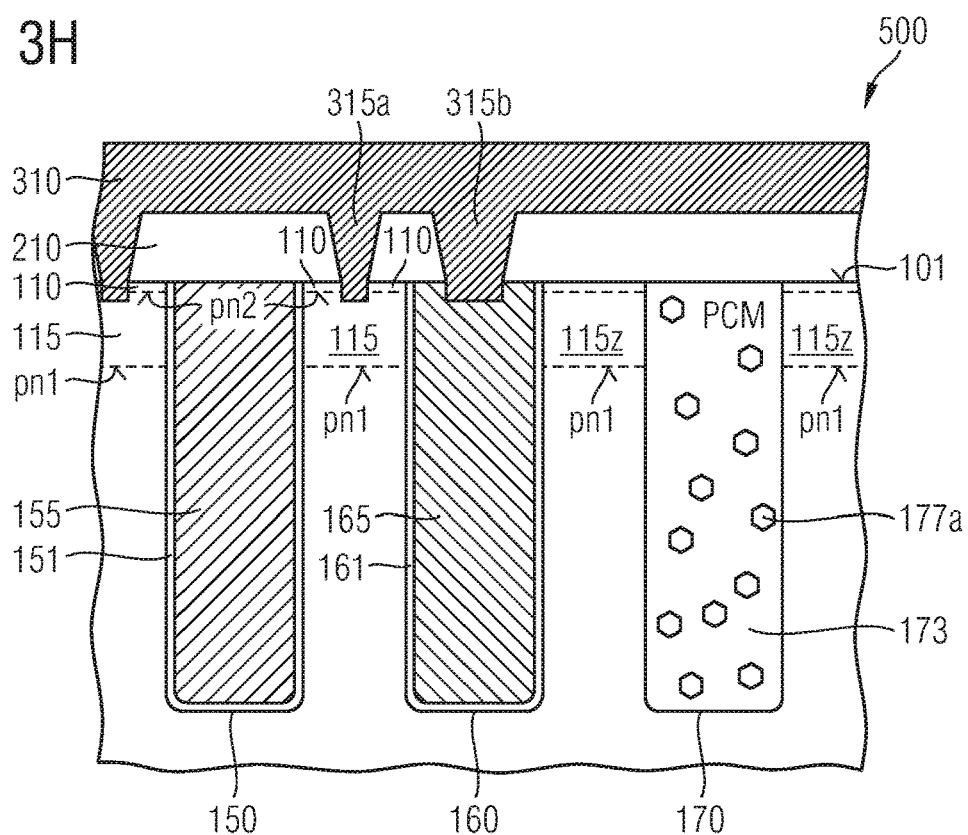

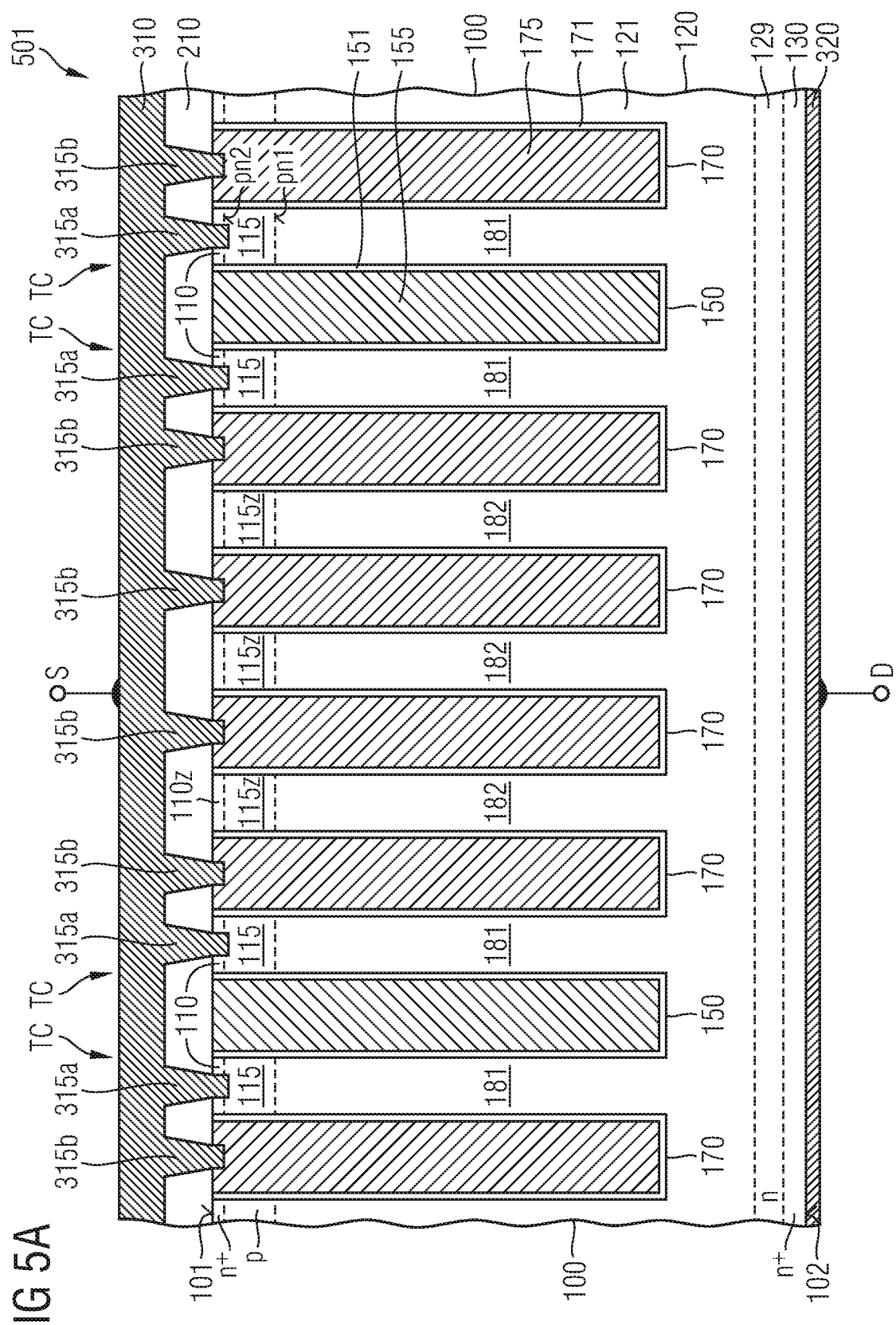

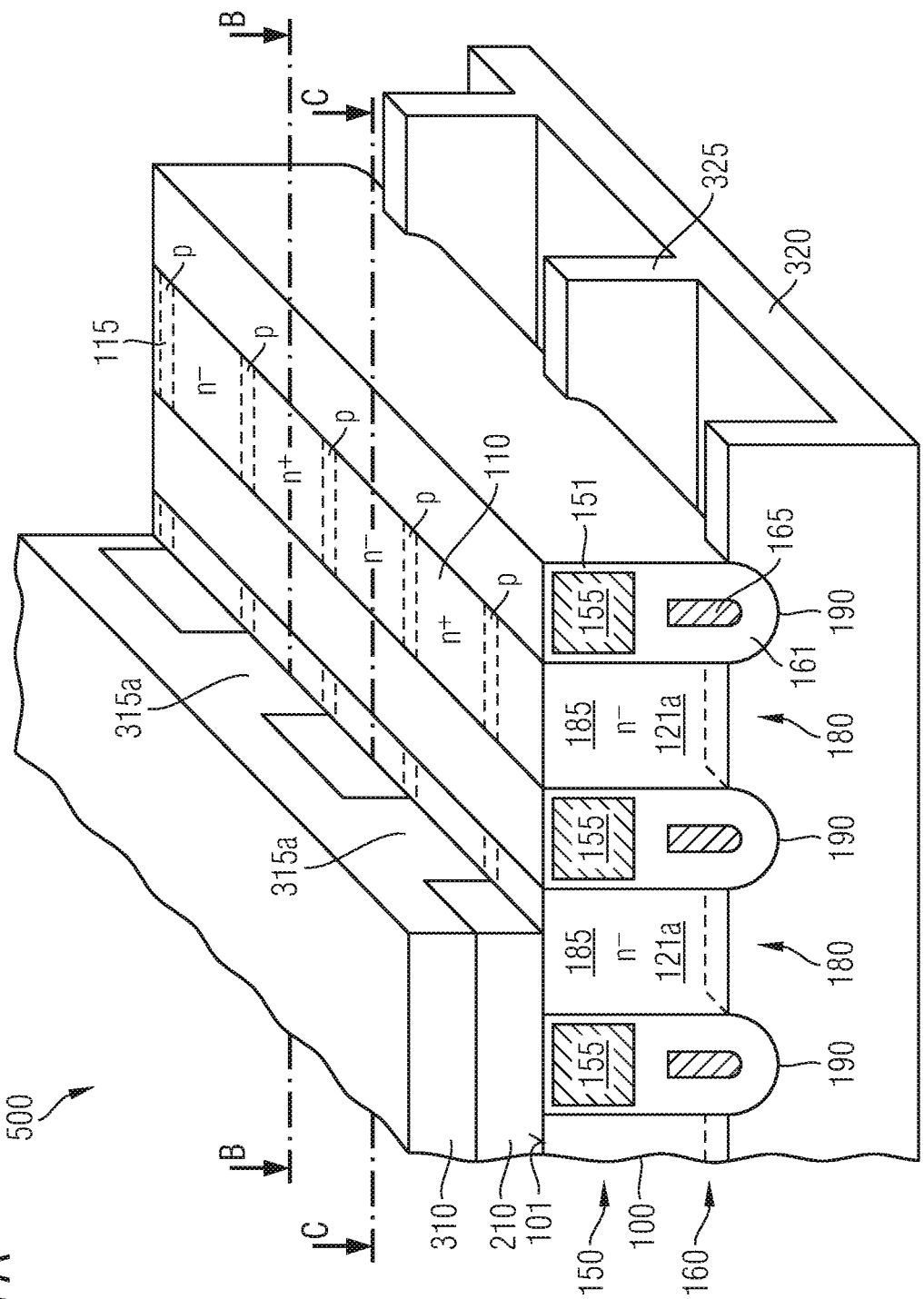

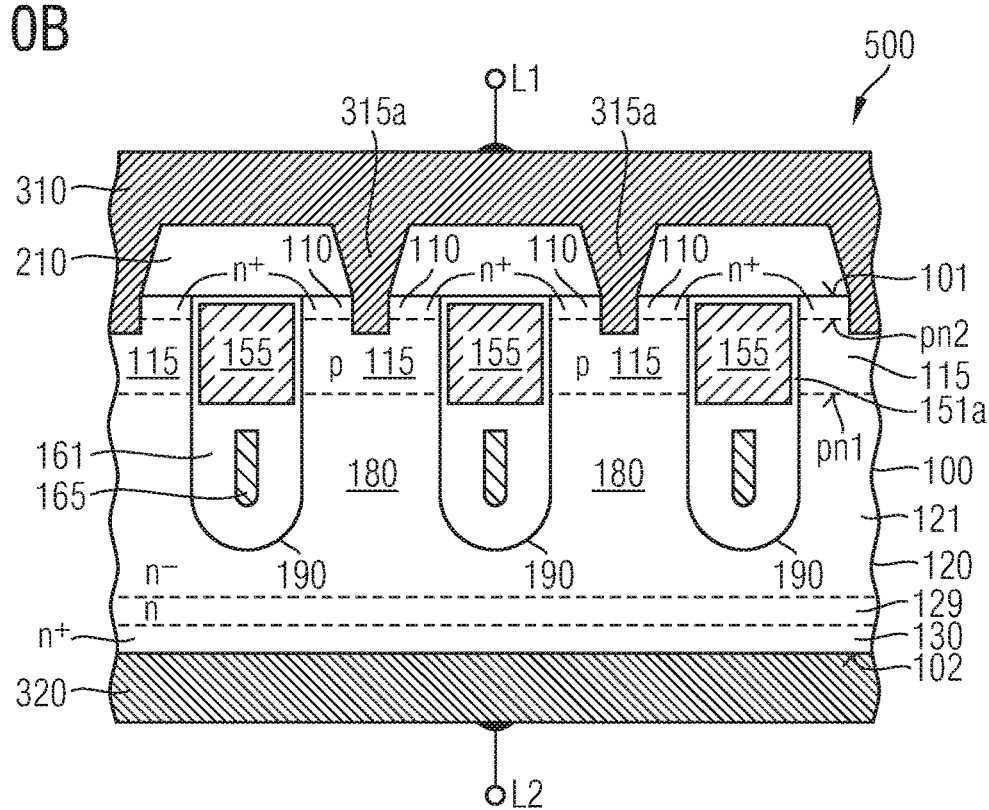
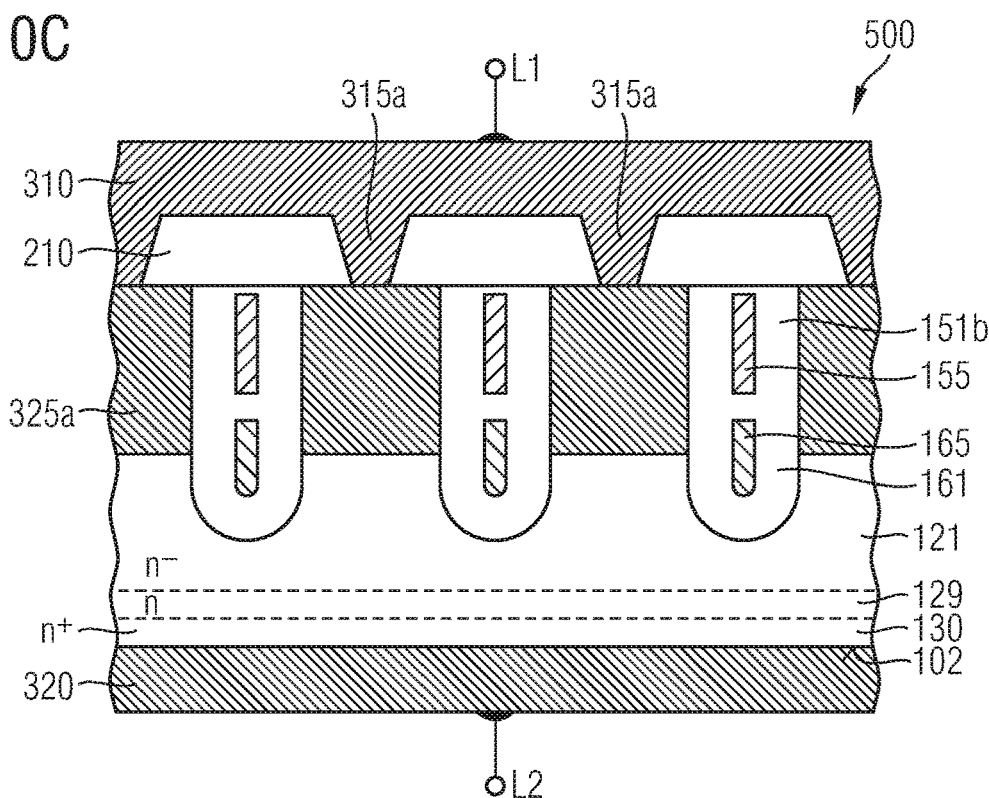

SEMICONDUCTOR DEVICE INCLUDING A HEAT SINK STRUCTURE

PRIORITY CLAIM

This application claims priority to German Patent Application No. 10 2015 122 804.1 filed on 23 Dec. 2015, the content of said application incorporated herein by reference in its entirety.

BACKGROUND

Power semiconductor devices transform to some degree electric energy into thermal energy. In case a short-circuit occurs or in case the power semiconductor device turns off in response to an over-current condition, the dissipated thermal energy may significantly exceed the thermal energy dissipated during normal operation mode. Designing a semiconductor body of the semiconductor device to reliably sustain short-term thermal stress typically adversely impacts device characteristics. Conventionally, a thick copper metallization is thermally coupled to the semiconductor body and dissipates the thermal energy generated in the semiconductor body.

There is a need for semiconductor devices with high thermal resilience.

SUMMARY

According to an embodiment a semiconductor device includes a drift structure which is formed in a semiconductor body and which forms a first pn junction with a body zone of a transistor cell. A gate structure extends from a first surface of the semiconductor body into the drift structure. A heat sink structure extends from the first surface into the drift structure. A thermal conductivity of the heat sink structure is greater than a thermal conductivity of the gate structure and/or a thermal capacity of the heat sink structure is greater than a thermal capacity of the gate structure.

According to another embodiment a semiconductor device includes a semiconductor body that includes semiconducting portions of a transistor cell, A source contact structure directly adjoins at least a source zone of the transistor cell at a front side of the semiconductor body. A heat sink feature extends from a rear side into the semiconductor body. At least one of (i) a thermal conductivity of the heat sink feature is greater than a thermal conductivity of the semiconductor body and (ii) a thermal capacity of the heat sink structure is greater than a thermal capacity of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1B is a schematic cross-sectional view of portions of a semiconductor device according to an embodiment including field plate structures in addition to gate structures and heat sink structures.

FIG. 3A is a schematic vertical cross-sectional view of a portion of a semiconductor device with a homogeneous heat sink structure based on a material with high thermal capacitance according to an embodiment.

FIG. 3B is a schematic vertical cross-sectional view of a portion of a semiconductor device with a heat sink structure based on a PCM (phase change material) and a barrier layer according to a further embodiment.

FIG. 3O is a schematic vertical cross-sectional view of a portion of a semiconductor device with a heat sink structure based on a partial fill with PCM according to a further embodiment.

FIG. 3D is a schematic vertical cross-sectional view of a portion of a semiconductor device with a heat sink structure based on a PCM with air pockets according to a further embodiment.

FIG. 3E is a schematic vertical cross-sectional view of a portion of a semiconductor device with heat sink structures including a thermally high-conductive dielectric layer.

FIG. 3F is a schematic vertical cross-sectional view of a portion of a semiconductor device with heat sink structures including thermally high-conductive structures along an interface to a semiconductor body according to an embodiment referring to carbon nanotubes.

FIG. 3G is a schematic vertical cross-sectional view of a portion of a semiconductor device with heat sink structures including thermally high-conductive structures along an interface to a semiconductor body according to an embodiment referring to diamond crystallites.

FIG. 3H is a schematic vertical cross-sectional view of a portion of a semiconductor device with PCM-based heat sink structures including thermally high-conductive inclusions according to an embodiment referring to diamond crystallites.

FIG. 5A is a schematic vertical cross-sectional view of a portion of an n-FET according to an embodiment.

FIG. 7A is a schematic perspective view of a portion of a semiconductor device according to an embodiment with stripe-shaped heat sink features connected to a load electrode at a rear side.

FIG. 10B is a schematic vertical cross-sectional view of the semiconductor device portion of FIG. 10A along line B-B.

FIG. 10C is a schematic vertical cross-sectional view of the semiconductor device portion of FIG. 10A along line C-C.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open, and the terms indicate the presence of stated structures, elements or features but do not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
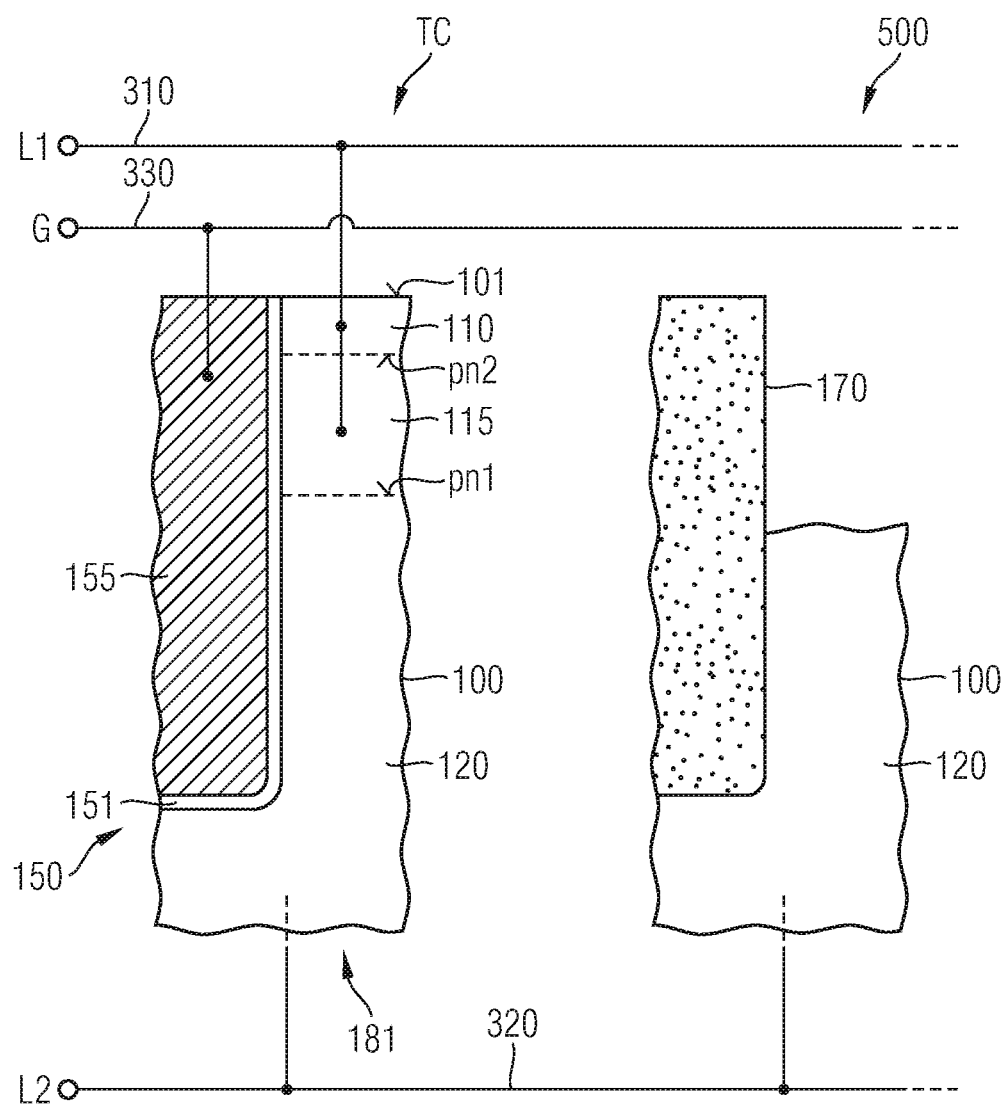
FIG. 1A is a schematic vertical cross-sectional view of portions of a semiconductor device including gate structures and heat sink structures extending from the first surface into a semiconductor body according to an embodiment.

FIG. 1A shows a portion of a semiconductor device 500, which may be, for example, an MGD (MOS gated diode), an IGFET (insulated gate field effect transistor), e.g., a MOSFET (metal oxide semiconductor FET) in the usual meaning including FETs with metal gate and FETs with semiconductor gate, an IGBT (insulated gate bipolar transistor), e.g., a reverse blocking IGBT or a reverse conducting IGBT, or a device including further electronic circuits in addition to an MGD, IGFET, or IGBT functionality.

The semiconductor device 500 includes transistor cells TC. Semiconducting portions of the transistor cells TC are formed in a semiconductor body 100, which is formed from crystalline semiconductor material such as silicon (Si), germanium (Ge), silicon germanium (SiGe), silicon carbide (SiC) or an $A_{III}B_V$ semiconductor.

A distance between a first surface 101 at a front side of the semiconductor body 100 and an opposite second surface at a rear side may be between 20 μm and several 100 μm. Directions parallel to the first surface 101 are horizontal directions and a direction perpendicular to the first surface 101 is a vertical direction.

The transistor cells TC may be IGFET cells with gate structures 150 extending from the first surface 101 into the semiconductor body 100. The gate structures 150 may be stripe-shaped with a first horizontal extension exceeding at least ten times a second horizontal extension orthogonal to the first horizontal extension or may be dot-shaped with both horizontal extensions within the same order of magnitude, e.g., approximately equal.

The gate structures 150 may include a conductive gate electrode 155 and a gate dielectric 151 separating the gate electrode 155 from the semiconductor body 100. According to other embodiments, the transistor cells TC may be JFET (junction field effect transistor) cells with a conductive gate electrode directly adjoining to the semiconductor body 100. The gate electrode 155 may be electrically connected to a control electrode 330 which may be formed at the front side and which may form or may be electrically connected or coupled to a gate terminal G.

The transistor cell TO includes a body zone 115 formed in an active mesa 181 of the semiconductor body 100, wherein the active mesa 181 directly adjoins to one or two of the gate structures 150. In the active mesa 181 the body zone 115 forms a first pn junction pn1 with a drift structure 120 and a second pn junction pn2 with a source zone 110, wherein the source zone 110 may be formed between the first surface 101 and the body zone 115.

The body zone 115 and the source zone 110 are electrically connected to a first load electrode 310, which may form or which may be electrically connected or coupled to a first load terminal L1. The drift structure 120 is electrically connected or coupled directly or through a pn junction to a second load electrode 320, which may form or which may be electrically connected or coupled to a second load terminal L2.

The semiconductor device 500 further includes a heat sink structure 170 extending from the first surface 101 into the drift structure 120. Either the specific thermal capacity of the heat sink structure 170 is significantly greater than the specific thermal capacity of the gate structure 150, or the specific thermal conductivity of the heat sink structure 170 is significantly greater than the specific thermal conductivity of the gate structure 150, or both the specific thermal capacity and the specific thermal conductivity of the heat sink structure 170 are significantly greater than the specific thermal capacity and the specific thermal conductivity of the gate structure 150. For example, the specific thermal capacity of the heat sink structure 170 is at least twice or at least tenfold the specific thermal capacity of the gate structure 150. Alternatively or in addition, the specific thermal conductivity of the heat sink structure 170 is at least twice, at least five times, at least tenfold or at least twenty times the specific thermal conductivity of the gate structure 150.

According to an embodiment at least some of the heat sink structures 170 are thermally connected to a cooling structure formed outside of and in a distance to the semiconductor body 100. The cooling structure may be the first load electrode 310, the control electrode 330 or an auxiliary electrode electrically separated from the first load electrode 310 and the control electrode 330.

The heat sink structure 170 absorbs, dissipates, or absorbs and dissipates thermal energy to a higher degree than the gate structures 150. Since the heat sink structures 170 directly adjoin to electric active portions of the semiconductor body 100, thermal energy generated in a portion of the drift structure 120 next to the gate structures 150 during an overcurrent condition, short-circuit or avalanche breakdown can be instantly and directly removed from the semiconductor body 100 without that the thermal energy passes further semiconductor regions at the risk of thermal destruction of the crystal lattice of the semiconductor body 100.

In IGBTs with high short-circuit ruggedness active gate structures are typically formed only in a portion of the available total chip area. Further trench structures with the same dimensions as the gate structures 150, e.g. field plate structures are typically formed in addition to the gate structures 150, wherein the further trench structures and the gate structures form a regular pattern.

The same patterning process may be used to define both the gate structures 150 and the heat sink structures 170 such that the heat sink structures 170 may be formed at comparatively low additional process complexity. A vertical extension of the heat sink structures 170 may deviate from a vertical extension of the gate structures 150 by not more than 20%, e.g., by not more than 10%, or at most 5%. According to an embodiment, the vertical extension of the heat sink structures 170 is equal to the vertical extension of the gate structures 150. The heat sink structures 170 may be stripe-shaped with a first horizontal extension exceeding at least ten times a second horizontal extension orthogonal to the first horizontal extension or may be dot-shaped with both horizontal extensions within the same order of magnitude, e.g., approximately equal.

By configuring at least some of the further trench structures as heat sink structures 170, thermal ruggedness of the semiconductor device 500 can be improved without any loss of area efficiency. Using the further trench structures for dissipating thermal energy allows for further increasing the horizontal area ratio between trench structures on one hand and mesas on the other hand. The heat sink structures 170 directly adjoin portions of the semiconductor body 100 in which otherwise thermal conductivity is low because of the patterning with the trench structures. Compared to heat dissipation through the gate structures alone, heat can be dissipated through a significantly larger thermal contact area. In addition, the heat sink structures 170 may contribute to hole confinement and in this way contribute to the reduction of losses.

In FIG. 1B the semiconductor device 500 further includes field plate structures 160 extending from the first surface 101 into the drift structure 120. The field plate structures 160 include a conductive field plate 165 and a field dielectric 161 separating the field plate 165 from the semiconductor body 100. The field plate 165 may be electrically connected to the first load electrode 310, to the control electrode 330 or to a field plate terminal separated from the control terminal G and the first load terminal L1.

The heat sink structure 170 may be electrically non-conductive, may include an electrically conductive portion without electric connection, or may include an electrically conductive portion electrically connected to a cooling body outside of the semiconductor body 100, e.g., the first load electrode 310.

FIGS. 2A to 2E illustrate different embodiments of the heat sink structures 170 partly in combination with field plate structures 160 for a layout with four further trench structures formed between pairs of active gate structures

150. Similar considerations apply to embodiments with one, two, three, five, six or more further trench structures between each pair of gate structures 150.

Figure 2A:
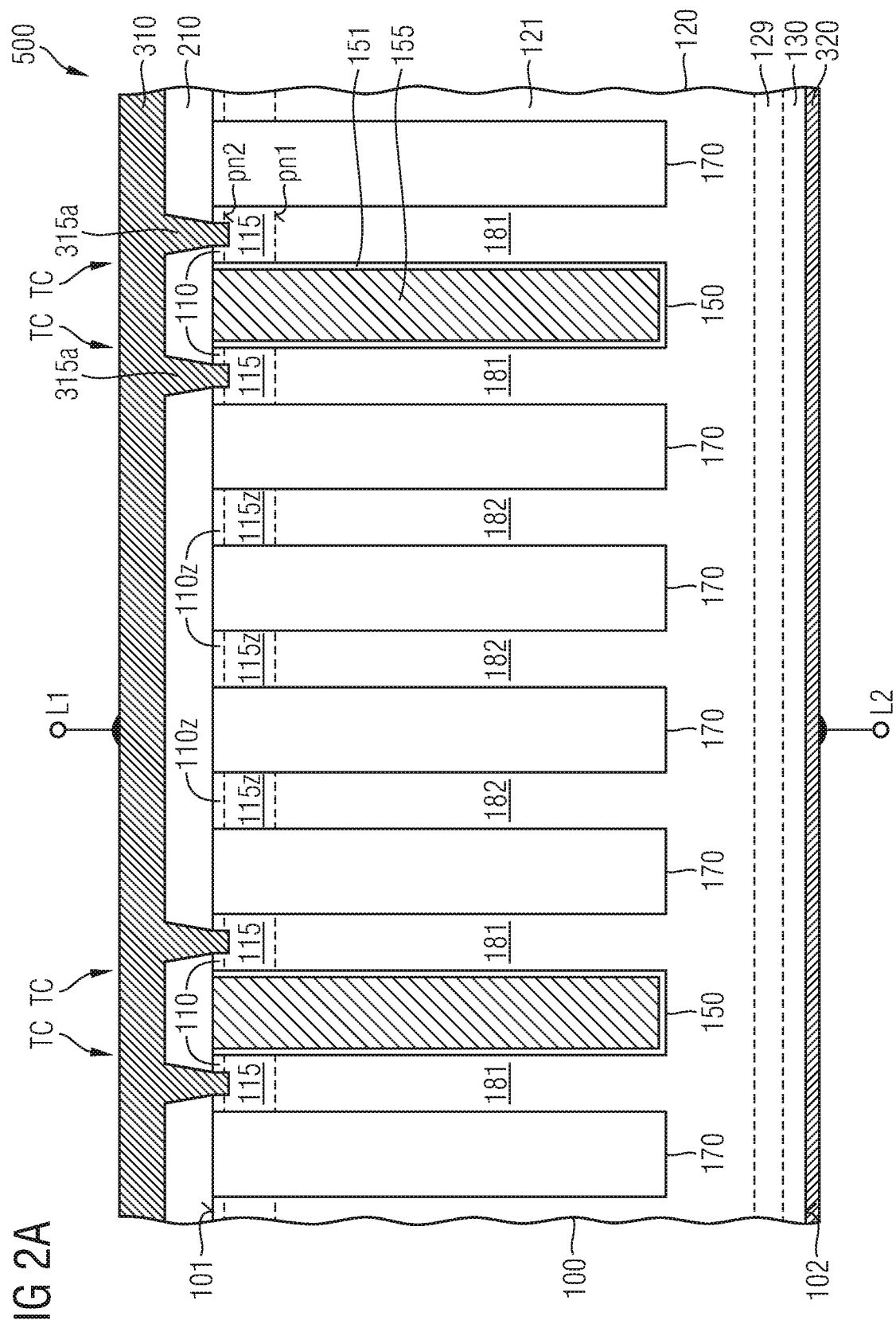
FIG. 2A is a schematic vertical cross-sectional view of a portion of a semiconductor device according to an embodiment related to heat sink structures with high thermal capacitance and electrically insulated from a load electrode.

FIG. 2A refers to a semiconductor device 500, which semiconductor body 100 is based on a crystalline semiconductor material, e.g., Si, Ge, SiGe, SiC or an $A_{III}B_V$ semiconductor. At a front side the semiconductor body 100 has a first surface 101 which may be defined by a plane spanned by coplanar top surfaces of active and idle mesas 181, 182 formed from sections of the semiconductor body 100 between neighboring trench structures. A planar second surface 102 at the opposite rear side is parallel to the first surface 101.

A minimum distance between the first and second surfaces 101, 102 is selected to achieve a specified voltage blocking capability of the semiconductor device 500 and may be at least 20 μm. For example, the distance between the first and second surfaces 101, 102 may be in a range from 90 μm to 110 μm for a semiconductor device 500 specified for a blocking voltage of about 1200 V. Embodiments related to semiconductor devices 500 with higher blocking capability may provide semiconductor bodies 100 with a thickness of several 100 μm.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are horizontal directions.

In the semiconductor body 100 a pedestal layer 130 is sandwiched between a drift structure 120 and the second surface 102. The pedestal layer 130 may have the same conductivity type as the drift structure 120, a complementary conductivity type, or may include zones of both conductivity types. In the pedestal layer 130 a dopant concentration along the second surface 102 is sufficiently high to form an ohmic contact with a metal layer formed in direct contact with the second surface 102.

The drift structure 120 may include a lightly doped drift zone 121 and a more heavily doped buffer or field stop zone 129 sandwiched between the drift zone 121 and the pedestal layer 130. A dopant concentration in the drift zone 121 may gradually or in steps increase or decrease with increasing distance to the first surface 101 at least in portions of its vertical extension. According to other embodiments the dopant concentration in the drift zone 121 may be approximately uniform. A mean dopant concentration in the drift zone 121 may be between $1E12$ cm$^{-3}$ and $1E15$ cm$^{-3}$, for example in a range from $5E12$ cm$^{-3}$ to $8E13$ cm$^{-3}$. A mean dopant concentration in the buffer or field stop zone 129 is at least five times, for example at least ten times as high as the mean dopant concentration in the drift zone 121.

Gate structures 150 extend from the first surface 101 into the semiconductor body 100. The gate structures 150 may include a conductive gate electrode 155 and a gate dielectric 151 separating the gate electrode 155 from the semiconductor body 100. The gate electrode 155 may be a homogeneous structure or may have a layered structure including one or more metal containing layers. According to an embodiment, the gate electrode 155 may include or consist of a heavily doped polycrystalline silicon layer.

The gate dielectric 151 may include or consist of a semiconductor oxide, e.g., a thermally grown or deposited silicon oxide, a semiconductor nitride, e.g., deposited or thermally grown silicon nitride, a semiconductor oxynitride, e.g., silicon oxynitride, by way of example.

The gate structures 150 may be stripe-shaped or dot-shaped. A vertical extension of the gate structures 150 may range from 1 μm to 30 μm, e.g., from 3 μm to 7 μm. A lateral width of the active mesas 181 and the idle mesas 182 may range from 0.05 μm to 10 μm, e.g., from 0.15 μm to 1 μm. A distance between the first surface 101 and the first pn junction pn1 may range from 0.5 μm to 5 μm, e.g., from 1 μm to 1.5 μm.

Between neighboring gate structures 150 one or more heat sink structures 170 may extend from the first surface 101 into the drift structure 120. The heat sink structures 170 may be stripe-shaped or dot-shaped. For example, horizontal cross-sections of both the gate structures 150 and the heat sink structures 170 may be stripe-shaped or both may be dot-shaped. According to an embodiment, the gate structures 150 are stripe-shaped and the heat sink structures 170 are dot-shaped or the gate structures 150 are dot-shaped and the heat sink structures 170 are stripe-shaped.

Semiconducting portions of transistor cells TC are formed in active mesas 181 that separate the gate structures 150 from neighboring trench structures, e.g., from neighboring heat sink structures 170. The active mesas 181 include body zones 115 and source zones 110, wherein the body zones 115 form first pn junctions pn1 with the drift structure 120 and second pn junctions pn2 with the source zones 110.

Portions of the semiconductor body 100 separating neighboring heat sink structures 170 form idle mesas 182. The idle mesas 182 may or may not include idle body zones 115z and/or idle source zones 110z with vertical extensions corresponding to the vertical extensions of the source zones 110 and the body zones 115 in the active mesas 181.

An interlayer dielectric 210 may be formed on the first surface 101. The interlayer dielectric 210 may include one or more layers of semiconductor oxide, e.g., silicon oxide, semiconductor nitride, e.g., silicon nitride, or semiconductor oxynitride, e.g., silicon oxynitride, which may be layers thermally grown on or deposited on the semiconductor body 100, and/or one or more layers of doped or undoped glass, e.g., BSG (boron silicate glass), PSG (phosphorus silicate glass), BPSG (boron phosphorus silicate glass), FSG (fluorosilicate glass), USG (undoped silicate glass) or a spin-on glass.

A first load electrode 310 is formed on the interlayer dielectric 210 such that the interlayer dielectric 210 is sandwiched between the first load electrode 310 and the semiconductor body 100. The first load electrode 310 may form or may be electrically coupled or connected to a first load terminal L1, which may be an emitter terminal of an IGBT, a source terminal of an FET or an anode terminal of a power semiconductor diode, by way of example.

Source contact structures 315a extend from the first load electrode 310 through the interlayer dielectric 210 to or into the semiconductor body 100 and electrically connect the source zones 110 and the body zones 115 of the active mesas 181 with the first load electrode 310.

A second load electrode 320 directly adjoining the pedestal layer 130 and the second surface 102 may form or may be electrically coupled or connected to a second load terminal L2, which may be a collector terminal of an IGBT, a drain terminal of an FET or a cathode terminal of a power semiconductor diode, by way of example.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

The heat sink structures 170 may be dielectric or low-conductive structures that may be homogeneous or layered, wherein dielectric or low-conductive portions may separate a highly electric conductive portion from the semiconductor body 100. At least one of the materials of the heat sink structures 170 may have a significant higher specific thermal capacity than the gate electrode 155. For example, the heat sink structures 170 may contain an electrically non-conductive PCM (phase change material), which may directly adjoin to the semiconductor body 100 and which may embed thermally high-conductive inclusions such as carbon nanotubes, diamond particles and/or graphene particles.

According to another embodiment the heat sink structures 170 may include a thermally high-conductive dielectric portion directly adjoining to the semiconductor body 100 and an electrically conductive material with high thermal capacity, for example an electrically conductive PCM. The interlayer dielectric 210 may separate the heat sink structures 170 from electrically conductive structures formed at the front side of the semiconductor body 100, for example from the first load electrode 310.

A width of the active and idle mesas 181, 182 may be in a range from 0.1·L to 3·L, wherein L is the mean free path length of phonons in the semiconductor body 100 at a temperature of 125° C.

Figure 2B:
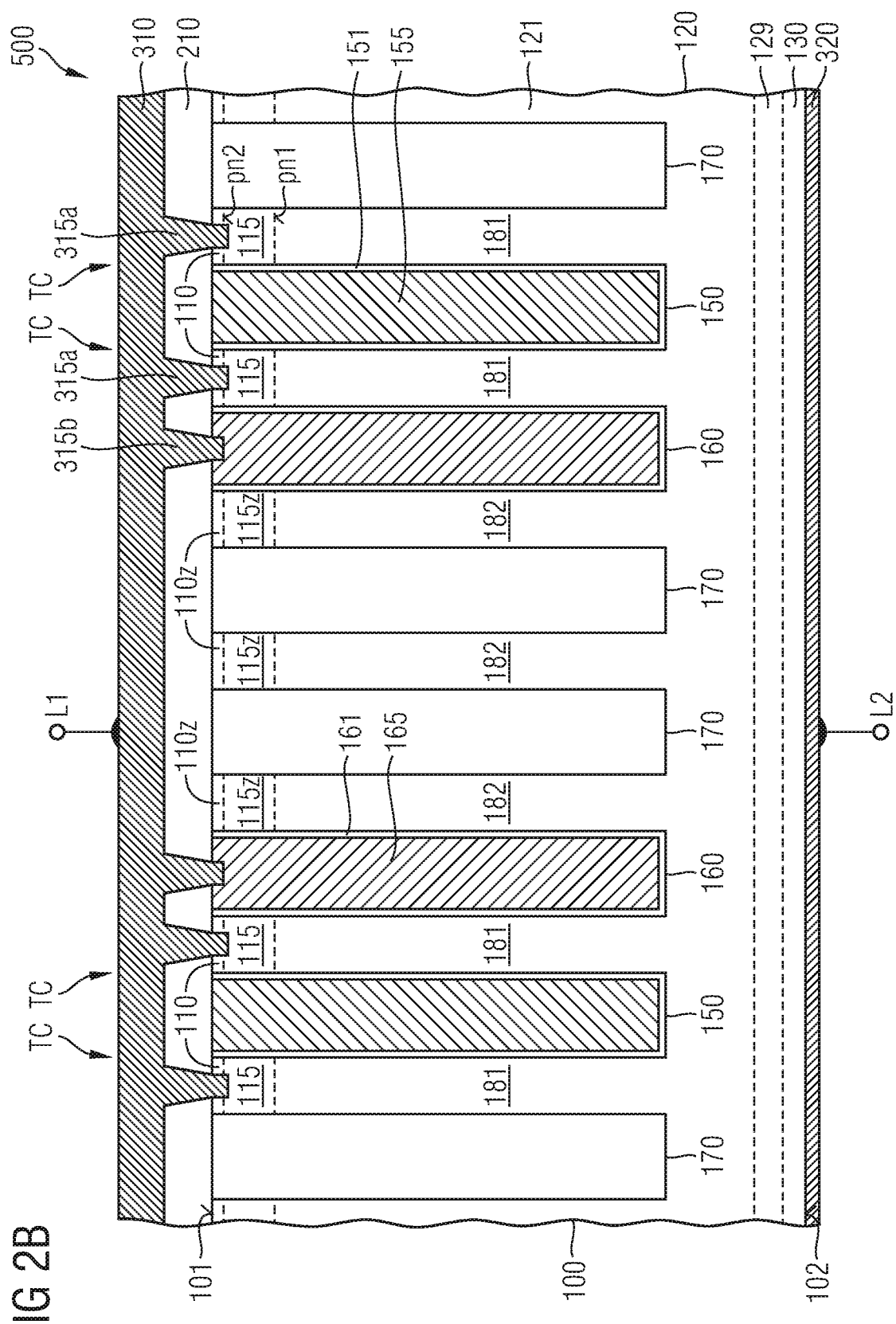
FIG. 2B is a schematic vertical cross-sectional view of a portion of a semiconductor device according to an embodiment related to heat sink structures with high thermal capacitance and electrically insulated from a load electrode in combination with field plate structures.
Figure 2C:
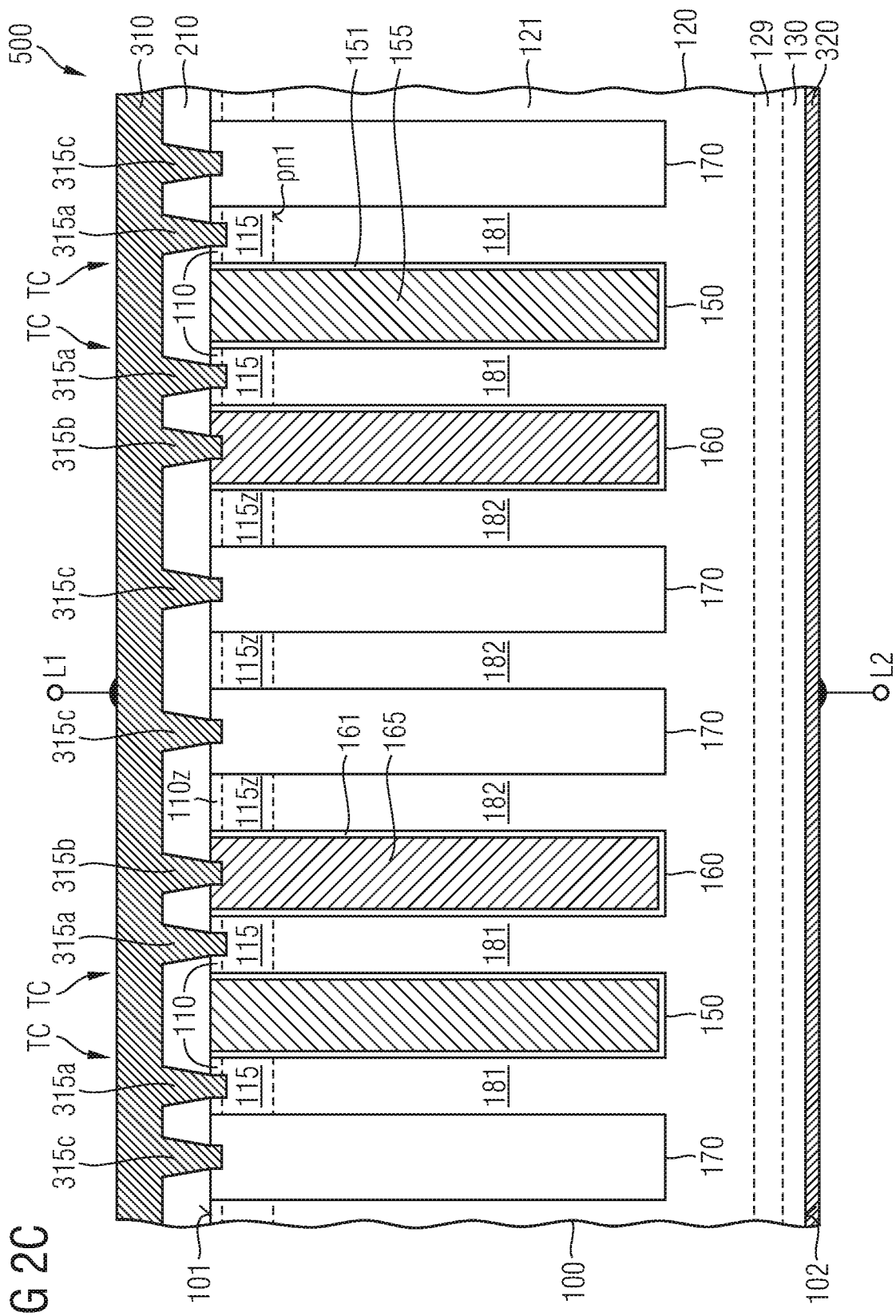
FIG. 2C is a schematic vertical cross-sectional view of a portion of a semiconductor device according to an embodiment related to dielectric heat sink structures with high thermal conductivity and thermally connected to a load electrode in combination with field plate structures.

In FIG. 2B the trench structures of the semiconductor device 500 include field plate structures 160 extending from the first surface 101 into the drift structure 120. The trench structures that form the gate structures 150, the field plate structures 160 and the heat sink structures 170 may have the same vertical and lateral extensions and may form a regular stripe pattern with uniform center-to-center distance.

The field plate structures 160 include a conductive field plate 165 and a field dielectric 161 separating the field plate 165 from the semiconductor body 100. The field plate 165 may be a homogeneous structure or may be a layered structure including one or more metal containing layers. According to an embodiment the field plate 165 may include or consist of a heavily doped polycrystalline silicon layer. Materials and internal configuration of the gate electrode 155 and the field plate 165 may be the same.

The field dielectric 151 may include or consist of a semiconductor oxide, e.g., a thermally grown or deposited silicon oxide, a semiconductor nitride, e.g., a deposited or thermally grown silicon nitride, a semiconductor oxynitride, e.g., a silicon oxynitride, by way of example. Materials and internal configuration of the field dielectric 161 and the gate dielectric 151 may be the same. Field plate contact structures 315b may extend from the first load electrode 310 through the interlayer dielectric 210 to or into the field plates 165 and may electrically connect the field plates 165 with the first load electrode 310.

The number of field plate structures 160 may be smaller than, greater than or equal to the number of heat sink structures 170. At least some of the field plate structures 160 may be formed next to active mesas 181. According to another embodiment, the heat sink structures 170 may be arranged between the field plate structures 160 and the active mesas 181.

Figure 2D:
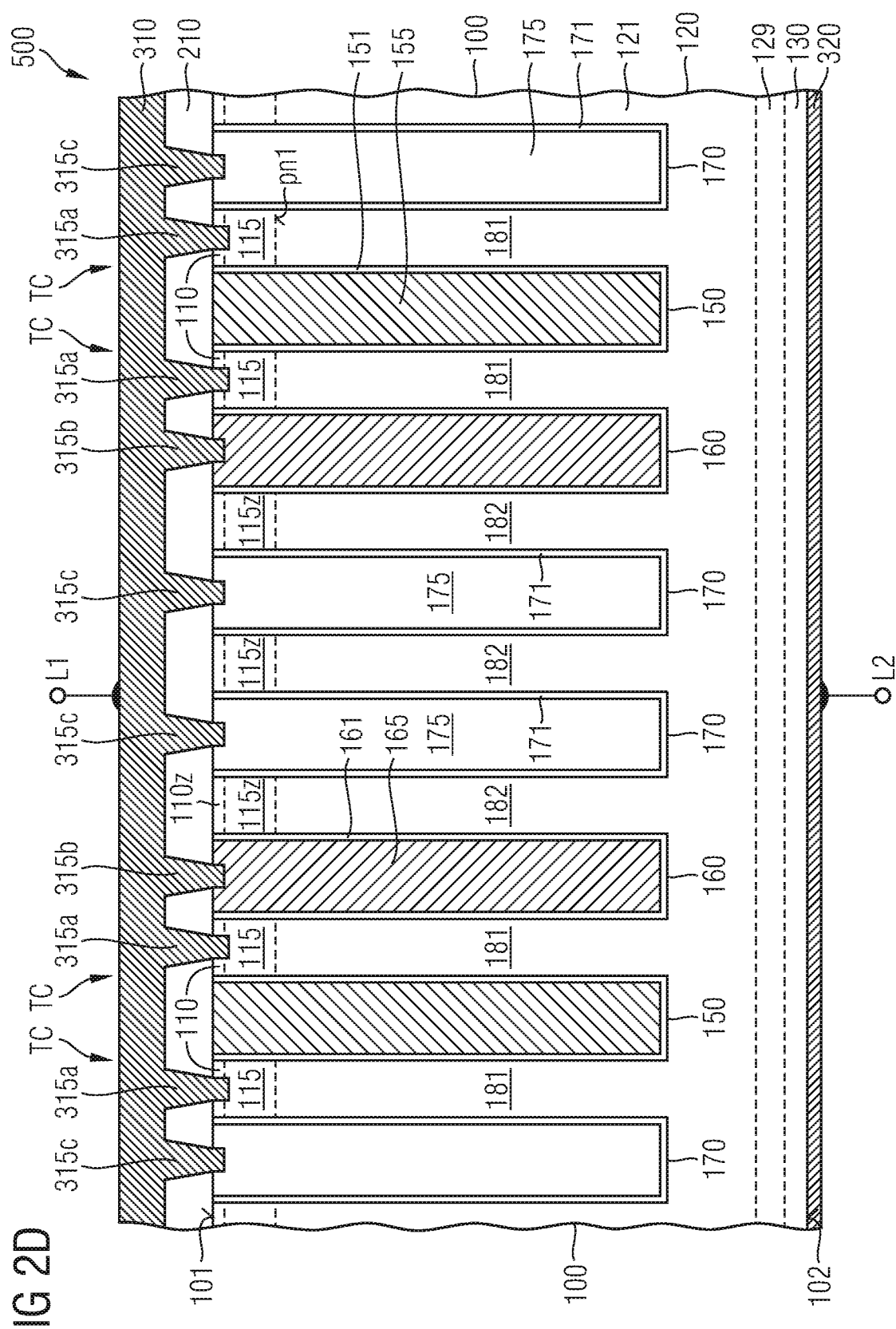
FIG. 2D is a schematic vertical cross-sectional view of a portion of a semiconductor device according to an embodiment related to a combination of field plate structures and heat sink structures with high thermal and electric conductivity, wherein the heat sink structures are electrically connected to a load electrode.

FIG. 2O shows heat sink structures 170 thermally connected to a cooling body outside of the semiconductor body 100. According to the illustrated embodiment, heat contact structures 315c extend from the first load electrode 310 through the interlayer dielectric 210 to or into the heat sink structures 170. The heat sink structures 170 may include thermally high-conductive and electrically non-conductive materials, or may have a layered structure with a thermally high-conductive dielectric portion 171 separating a thermally and electrically high-conductive center portion 175 of the heat sink structures 170 from the semiconductor body 100 as illustrated in FIG. 2D.

Figure 2E:
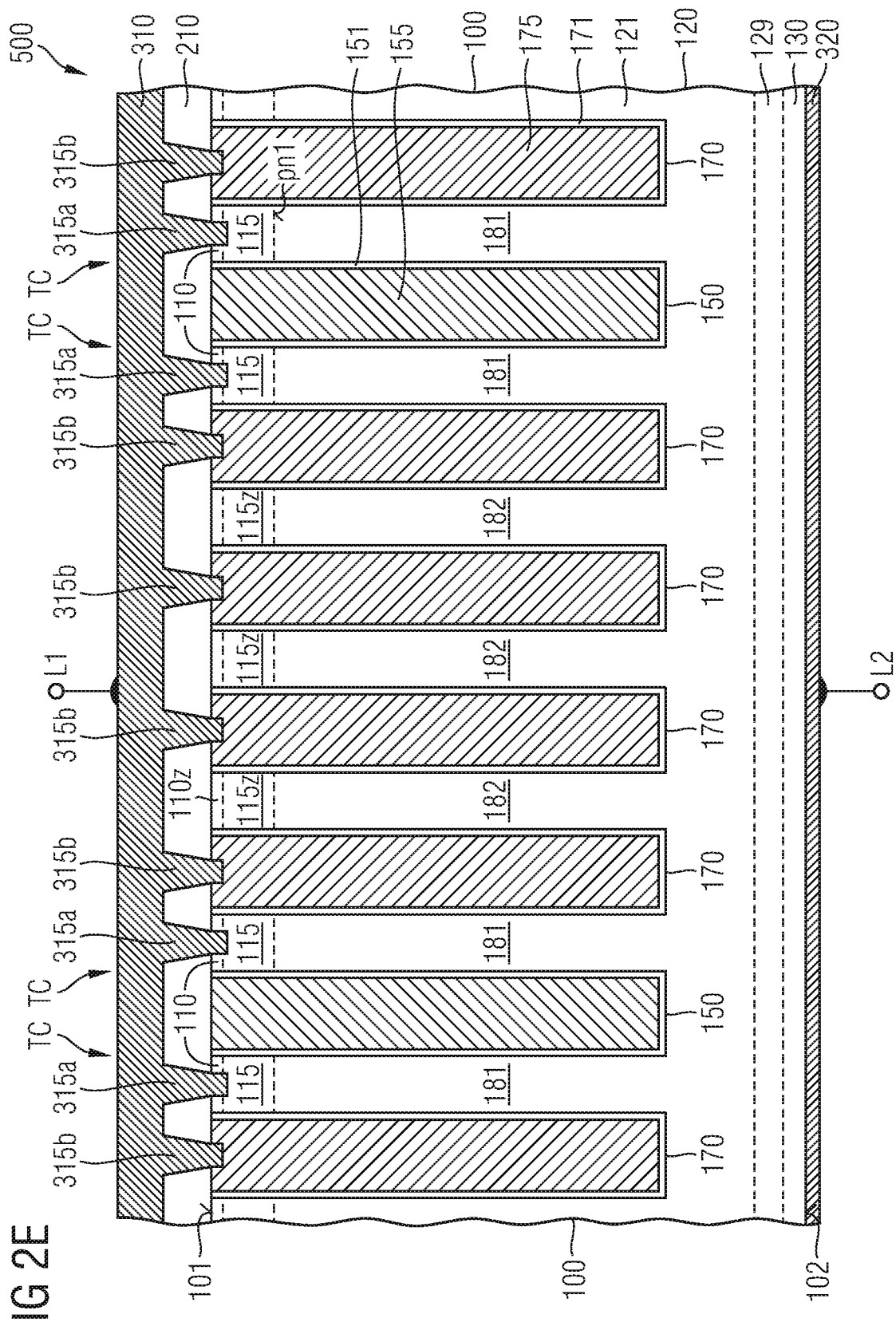
FIG. 2E is a schematic vertical cross-sectional view of a portion of a semiconductor device according to an embodiment related to heat sink structures with high thermal and electric conductivity, wherein the heat sink structures are effective as field plate structures.

FIG. 2E refers to an embodiment with all trench structures except the gate structures 150 being effective as heat sink structures 170 with a thermally high-conductive dielectric portion 171 separating an electrically and thermally high-conductive center portion 175 from the semiconductor body 100. Field plate contact structures 315b may be effective as the heat contact structures 315c of FIGS. 2C and 2D and electrically and thermally connect the center portions 175 with the first load electrode 310 such that the heat sink structures 170 are effective as field plate structures.

The materials and the internal configuration of the gate electrode 155 may differ from or may be the same as the material configuration of the center portions 175 of the heat sink structures 170. In addition or in the alternative, the material configuration of the gate dielectric 151 may differ or may be the same as that of the dielectric portion 171 of the heat sink structures 170.

FIGS. 3A to 3I refer to embodiments with a heat sink fill 173 dissipating thermal energy within an outer contour of the semiconductor body 100 by locally converting thermal energy into chemical or physical bond energy, for example by changing the phase of a suitable material from a low-energy state into a high-energy state. The phase change may be a solid-to-solid phase change with a phase change temperature between the nominal operation temperature and a critical temperature at which the crystal of the semiconductor body 100 is irreversibly destroyed.

The phase change may be reversible such that the PCM changes back into the initial state when the surrounding semiconductor body 100 cools down to the temperature of the normal operation mode and the heat sink fill 173 releases thermal energy back to the semiconductor body 100. According to other embodiments the phase change may be irreversible such that the semiconductor device 500 sustains only a certain number of short-circuits, over-current conditions and/or avalanche breakdowns.

In each of FIGS. 3A to 3I, both the gate structures 150 and the heat sink structures 170 may be stripe-shaped or dot-shaped. For example, horizontal cross-sections of both the gate structures 150 and the heat sink structures 170 may be stripe-shaped or both may be dot-shaped. According to an embodiment, the gate structures 150 are stripe-shaped and the heat sink structures 170 are dot-shaped or the gate structures 150 are dot-shaped and the heat sink structures 170 are stripe-shaped. In case of dot-shaped cross-sections, FIGS. 3A to 3I show cross-sectional views in two orthogonal vertical planes.

The heat sink structures 170 of FIGS. 3A to 3I may be insulated. For example, portions of the interlayer dielectric 210 may cover the heat sink structures 170 and may separate the heat sink structures 170 from conductive structures at the front side, e.g., the first load electrode 310. According to other embodiments, the heat sink structures 170 of FIGS. 3A to 3I may be connected to a cooling body outside of the semiconductor body 100 through a thermally high-conductive connection, which may be electrically non-conductive. The cooling body may be one of the electrodes of the semiconductor device 500. For further details as regards FIGS. 3A to 3I, reference is made to the description of FIGS. 2A to 2E.

In FIG. 3A a heat sink structure 170 includes a homogeneous heat sink fill 173, which may be or contain a PCM. According to an embodiment, the heat sink fill 173 is an electrically non-conductive PCM. The heat sink fill 173 locally dissipates thermal energy generated in the drift zone 121, e.g., by reversibly changing the phase of a PCM portion of the heat sink fill 173.

In FIG. 3B the heat sink structure 170 includes a barrier layer 174 separating the heat sink fill 173 from the semiconductor body 100. The barrier layer 174 is thermally highly conductive and may prevent contamination agents contained in the heat sink fill 173 from diffusing into the semiconductor body 100. The barrier layer 174 may be or may include a polycrystalline diamond layer deposited, e.g., by chemical vapor deposition or an inorganic ceramic such as AlN, boron nitride or silicon nitride $Si_3N_4$, by way of example. According to other embodiments, the barrier layer 174 may be effective as a thermally high-conductive shell for the heat sink fill 173.

The heat sink fill 173 may homogeneously fill the complete heat sink structure 170 or may only partially fill the heat sink structure 170.

In FIG. 3C the material of the heat sink fill 173 is deposited such that a central gap 175a is formed in the center of the heat fill structure 170.

In FIG. 3D the heat sink structure 170 includes air pockets (air inclusions) 175b.

Voids in the heat sink fill 173, e.g., the gap 175a or the air pockets 175b may be filled with a fluid or, for example ambient air, and may reduce thermal-mechanical stress induced by the heat sink fill 173 into the semiconductor body 100, e.g., when the heat sink fill 173 changes the phase.

The heat sink fill 173, e.g., a PCM, may directly adjoin to the semiconductor body 100. According to the embodiments of FIG. 3E to 3G a thermally high-conductive structure may improve thermal conduction between the semiconductor body 100 and the heat sink fill 173, wherein the thermally high-conductive structure may be a continuous layer or may include separated portions formed along the interface to the semiconductor body 100.

In FIG. 3E a continuous thermally high-conductive dielectric portion 171 may separate the heat sink fill 173 from the semiconductor body 100. The dielectric portion 171 may be a layer containing diamond or diamond-like materials, boron nitride, aluminum nitride and/or beryllium oxide, by way of example.

FIG. 3F shows spatially separated carbon nanotubes 176a extending from an interface between the heat sink structure 170 and the semiconductor body 100 into the heat sink structure 170. The carbon nanotubes 176a may be oriented perpendicular to the interface between the heat sink structure 170 and the semiconductor body 100. The heat sink fill 173 may be a material with high thermal conductivity and/or high thermal capacity, e.g., a PCM and may embed the carbon nanotubes 176a and/or may partially or completely fill the carbon nanotubes 176a.

Formation of the carbon nanotubes 176a may include formation of crystallization nuclei on sidewalls of trenches temporarily extending into the semiconductor body 100. The crystallization nuclei may contain metal atoms effective as crystallization catalyst, for example, iron (Fe), cobalt (Co) or nickel (Ni) atoms. Then the carbon nanotubes are grown by CVD (chemical vapor deposition) using a carbon hydrogen gas, e.g., ethine as precursor material at a temperature of about 700° C. A plasma may promote growth of the carbon nanotubes. The carbon nanotubes 176a drastically improve thermal conduction from the semiconductor body 100 into the heat sink structure 170 and within the heat sink structure 170.

In FIG. 3G isolated thermally high-conductive diamond crystallites 176b may be formed along the interface between the heat sink structure 170 and the semiconductor body 100. A mean diameter of the diamond crystallites 176b may be between 50 nm and 2 µm, for example in a range from 100 nm to 1 µm. By adapting the mean diameter of the diamond crystallites 176b to a specific layout, e.g., to a horizontal dimension of the heat sink structure 170, the total thermal conductivity and response time of the heat sink structure 170 can be finely adjusted. The diamond crystallites 176b may be formed at temperatures in a range from 500° C. to 1200° C. at a pressure below 760 Torr using carbon hydrogen precursors, e.g., methane in presence of hydrogen radicals in excess. The hydrogen radicals may be formed in a plasma or at a heated tungsten (ON) wire. Deposition of the diamonds may be accelerated by adding diamond seed crystallites or by generating lattice defects in the semiconductor body 100.

Alternatively or in addition to thermally high-conductive structures 176a, 176b formed along the interface between the heat sink structure 170 and the semiconductor body 100, the heat sink structures 170 may contain thermally high-conductive auxiliary structures embedded within the heat sink fill 173.

In FIG. 3H the heat sink fill 173 embeds diamond crystallites 177a.

Figure 3I:
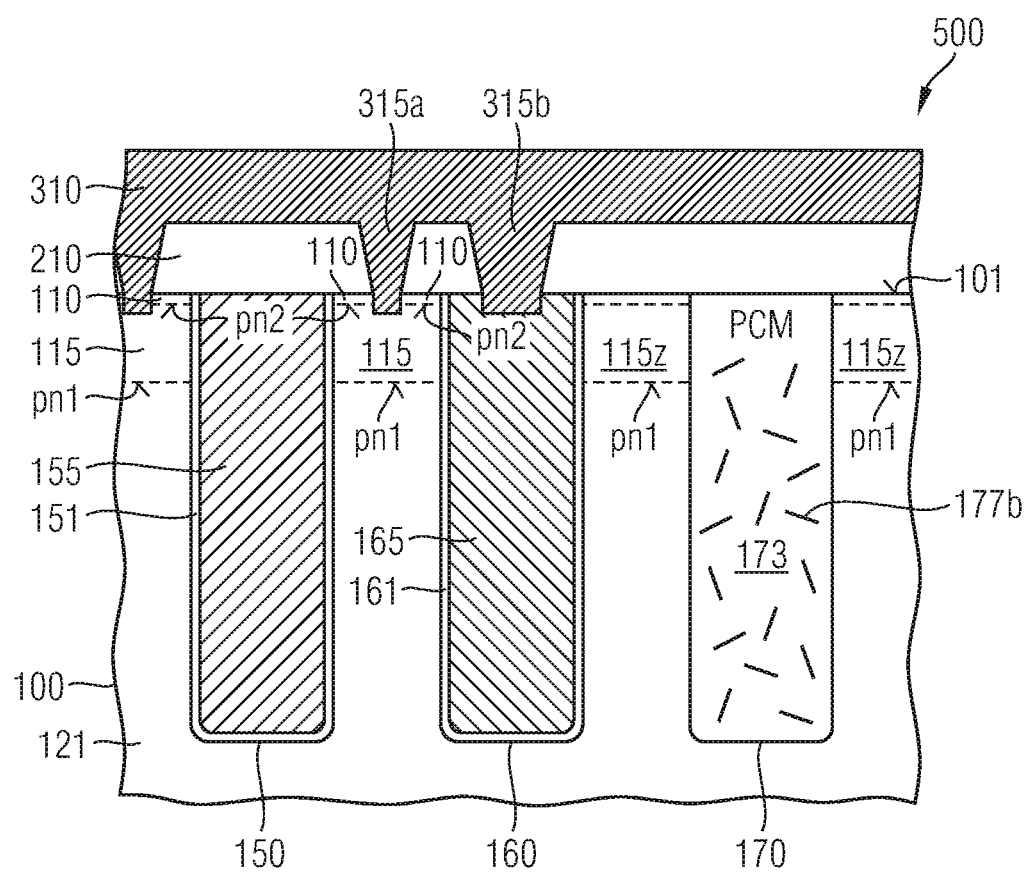
FIG. 3I is a schematic vertical cross-sectional view of a portion of a semiconductor device with PCM-based heat sink structures including thermally high-conductive inclusions according to an embodiment referring to graphene leaves.

The heat sink structure 170 illustrated in FIG. 3I embeds thermally high-conductive graphene flakes 177b, which may be graphene leaves.

Composite heat sink structures 170 including PCM embedding diamond crystallites or graphene leaves may be formed by a sol-gel process or by filling temporary trenches in the semiconductor body 100 with solutions or suspensions and then drying the solutions or suspensions in the trenches. Heat sink structures 170 including an electrically high-conductive heat sink fill 173 and a thermally high-conductive, continuous dielectric portion 171 may be used as field plate structures 160 and/or as gate structures 150.

According to an embodiment, the heat sink fill 173 contains ceramic PCM particles with a phase change from solid to solid at a temperature between the normal operation temperature of the semiconductor device 500 and a critical temperature at which the crystal lattice of the semiconductor body 100 is irreversibly damaged. A size of the ceramic PCM particles may be in a range from some nanometers to some micrometers. The ceramic PCM particles may embed, may be embedded in, or may be attached or embedded to carbon nanotubes. According to an embodiment the PCM is germanium tellurium (GeTe) with a phase change temperature between 350 and 400 degree Celsius.

The heat sink fill 173 may include core/shell structures with a shell of thermally high-conductive material, e.g., an aluminum nitride ceramic. The shell encapsulates a PCM. A thin dielectric layer from a heat resistive polymer such as polyimide may coat and envelop the shell.

Figure 4A:
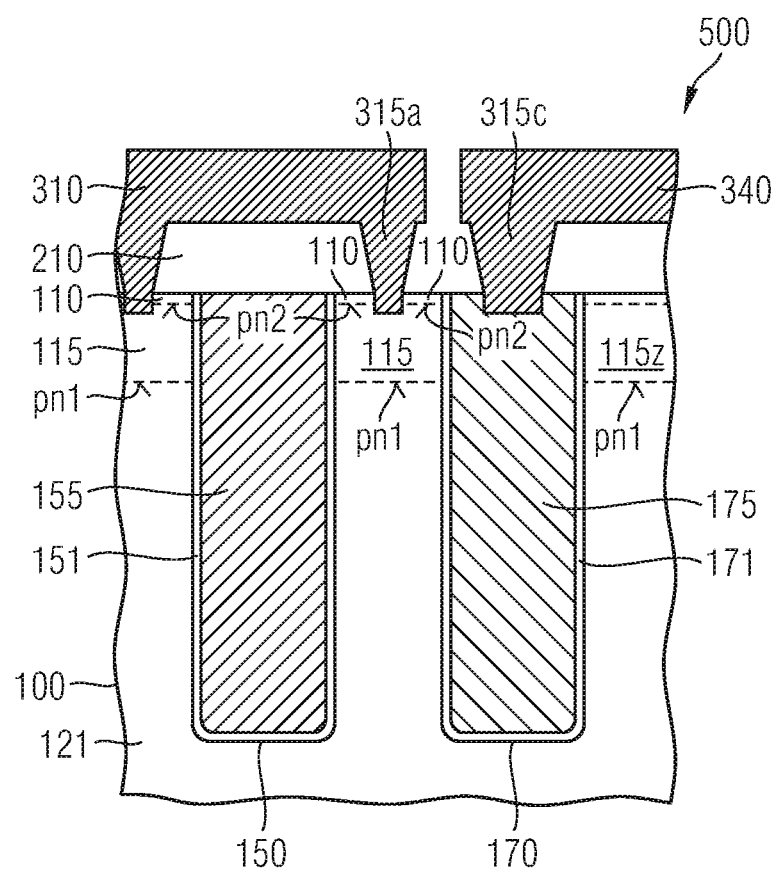
FIG. 4A is a schematic vertical cross-sectional view of a portion of a semiconductor device releasing thermal energy outside of a semiconductor body according to an embodiment referring to heat sink structures with thermally high-conductive dielectric portions.
Figure 4B:
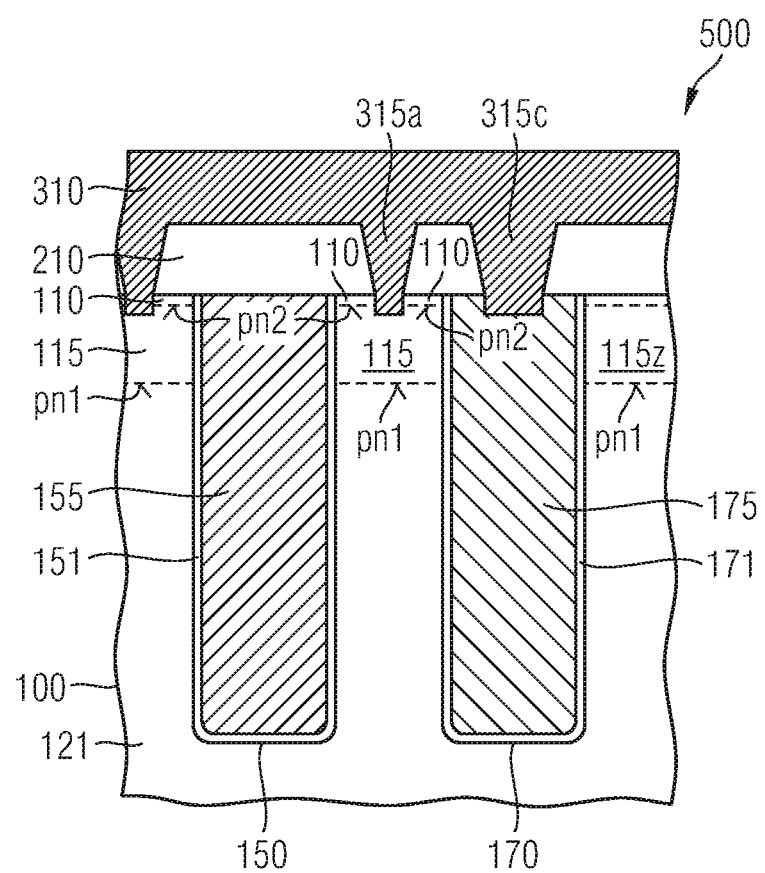
FIG. 4B is a schematic vertical cross-sectional view of a portion of a semiconductor device releasing thermal energy outside of a semiconductor body according to an embodiment referring to heat sink structures with dielectric portions thinner than a gate dielectric.

In FIGS. 4A to 4B, the heat sink structures 170 release the thermal energy to a cooling body 340 outside of the semiconductor body 100, wherein thermal conductivity of the heat sink structures 170 is higher than in the gate structures 150.

In FIG. 4A the heat sink structure 170 includes a dielectric portion 171 from a thermally high-conductive material such as diamond, a diamond-like material, boron nitride, aluminum nitride and/or beryllium oxides. The dielectric portion 171 conducts thermal energy from the semiconductor body 100 to an electrically high-conductive central portion 175, which may be heavily doped polycrystalline silicon, e.g., the same material as used as gate electrode or field plate. A heat contact structure 315c thermally connects the electrically high-conductive central portion 175 with a cooling body 340 outside of the semiconductor body 100. The cooling body 340 may be one of the electrodes of the semiconductor device 500 or a metallization electrically separated from the electrically active electrodes of the semiconductor device 500. For example, the cooling body 340 may be a portion of the first load electrode 310.

Materials for the dielectric portion 171 may be used exclusively in dedicated heat sink structures 170, or also as field dielectric in field plate structures, and/or also as gate dielectric in gate structures.

In addition to or alternatively to a thermally high-conductive dielectric portion 171, the heat sink structure 170 may include a central portion 175 formed from silicon carbide (SiC) which has a higher thermal conductivity than polycrystalline silicon. During deposition of silicon carbide, the carbon content may be varied to increase the thermal conductivity. Silicon carbide may be used exclusively in the heat sink structures 170 or may also be used as field plate and/or as gate electrode.

The heat sink structure 170 of FIG. 4B includes a dielectric portion 171 which is thinner than the gate dielectric 151 such that in the heat sink structure 170 the thermal resistance between the semiconductor body 100 and the electrically high-conductive central portion 175 is lower than between the semiconductor body 100 and the gate electrode 155. The heat sink structure 170 may be effective as field plate structures. A relative permittivity of the dielectric portion 171 may be lower than that of silicon oxide such that at equal capacity the thermal conductivity of the dielectric portion 171 is lower than that of the gate dielectric 151.

FIG. 5A shows an n-IGFET 501 based on any of the previous embodiments. For the illustrated embodiments a first conductivity type is n-type and a second conductivity type is p-type. Similar considerations as outlined below apply to embodiments with the first conductivity type being p-type and the second conductivity type being n-type.

The source zones 110 and the pedestal layer 130 are heavily n-doped, the drift zone 121 is lightly n-doped and the field stop layer 129 has a net dopant concentration of n-type dopants higher than in the drift zone 121 and lower than in the pedestal layer 130. The body zones 115 are p-type. The first load electrode 310 forms or is electrically connected to a source terminal S and the second load electrode 320 forms or is electrically connected to a drain terminal D A vertical extension of the gate structures 150 may be the same or may be smaller than a vertical extension of the field plate structures 160, which may be effective as heat sink structures 170.

Figure 5B:
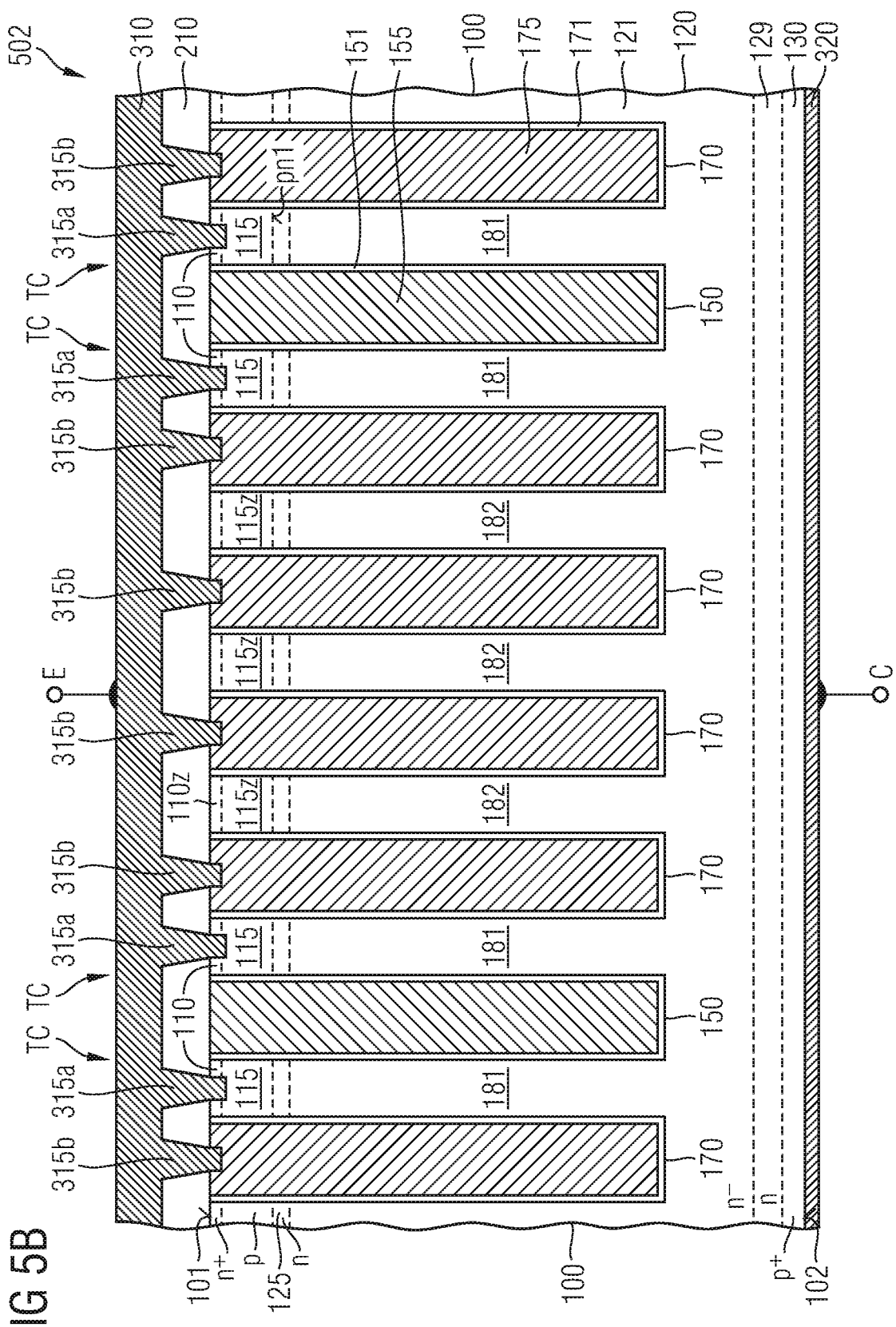
FIG. 5B is a schematic vertical cross-sectional view of a portion of a reverse blocking n-channel IGBT according to an embodiment.

FIG. 5B refers to an n-channel reverse blocking IGBT 502, The pedestal layer 130 is p-doped and the drift structure 120 may include a barrier layer at least partially formed along the first pn junction pn1, wherein a net n-type dopant concentration in the barrier layer 125 is higher than in adjoining portions of the drift zone 121. A lateral width of at least the gate structures 150 may have a maximum value in a distance to the first surface 101. The first load electrode 310 forms or is electrically connected to an emitter terminal E and the second load electrode 320 forms or is electrically connected to a collector terminal C.

Figure 5C:
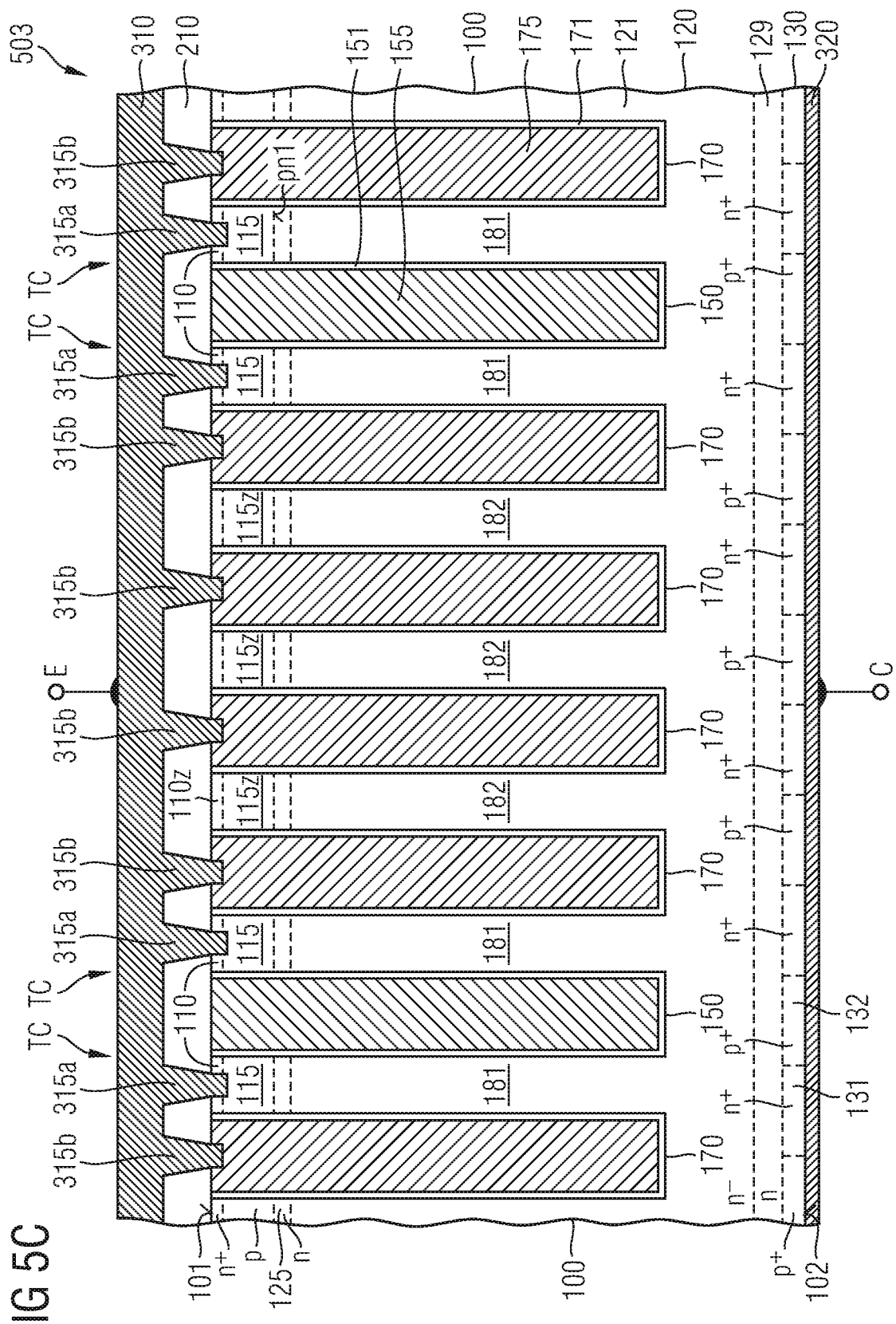
FIG. 5C is a schematic vertical cross-sectional view of a portion of a reverse conducting n-channel IGBT according to an embodiment.

FIG. 5C refers to an RC-IGBT 503 which differs from the reverse blocking IGBT of FIG. 5A mainly in that the pedestal layer 130 includes both n-type first zones 131 and p-type second zones 132. In addition, further contact structures may electrically connect the idle mesas 182.

Figure 6A:
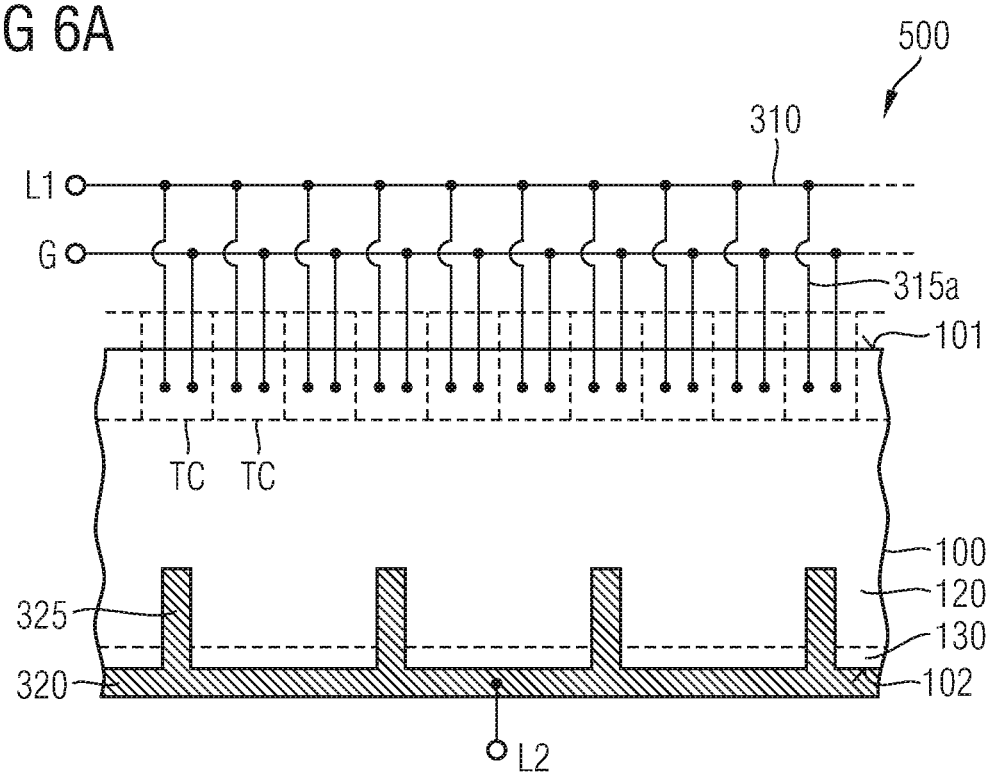
FIG. 6A is a schematic vertical cross-sectional view of a portion of a semiconductor device releasing thermal energy through heat sink features at a rear side according to an embodiment.

FIG. 6A shows a portion of a semiconductor device 500, which may be, for example, a power semiconductor diode such as an MGD (MOS gated diode), an IGFET (insulated gate field effect transistor), e.g., a MOSFET (metal oxide semiconductor FET) in the usual meaning including FETs with metal gate and FETs with semiconductor gate, an IGBT (insulated gate bipolar transistor), e.g., a reverse blocking IGBT or a reverse conducting IGBT, or a device including further electronic circuits in addition to an MGD, IGFET, or IGBT functionality.

The semiconductor device 500 includes transistor cells TC, wherein semiconducting portions of the transistor cells TC are formed along a front side of a semiconductor body 100, which is from a crystalline semiconductor material such as silicon (Si), germanium (Ge), silicon germanium (Site) or an $A_{III}B_V$ semiconductor. The semiconducting portion of a transistor cell includes a body zone forming a first pn junction with a drift structure 120 and a second pn junction with a source zone.

A distance between a first surface 101 at the front side of the semiconductor body 100 and an opposite second surface 102 at a rear side may be between 20 μm and several 100 μm. At the front side, source contact structures 315a form ohmic contacts between a first load electrode 310 and the source zones as well as between the first load electrode 310 and the body zones of the transistor cells TC, wherein the source contact structures 315a may directly adjoin the first surface 101 or may extend into the semiconductor body 100.

At the rear side a second load electrode 320 may directly adjoin to the second surface 102. In the semiconductor body 100, a pedestal layer 130 sandwiched between the drift structure 120 and the second load electrode 320 may form an ohmic contact with the second load electrode 320.

Heat sink features 325 may extend from the second surface 102 at the rear side into the semiconductor body 100. The heat sink features 325 may be equally spaced or may be arranged denser in portions of the semiconductor body 100 with lower thermal coupling to other heat conductive structures and/or with higher heat generation rate. The heat sink features 325 may be thermally and electrically connected to the second load electrode 320. A vertical extension of the heat sink features 325 may be at least 10% of the thickness of the semiconductor body 100, e.g., about 20%, about 50%, or may be selected to approximate the first pn junction pn1. According to another embodiment, the heat sink features 325 may extend from the second surface 102 to the first surface 101.

The heat sink features 325 may be parallel stripe structures that extend along a horizontal direction parallel to the first surface 101. According to another embodiment, two orthogonal horizontal dimensions of a heat sink feature 325 parallel to the first surface 101 may be within the same order of magnitude, e.g., approximately equal, wherein the heat sink features 325 may be arranged in orthogonal lines and rows. The heat sink features 325 may contain or consist of aluminum (Al), silver (Ag), copper (Cu), alloys of aluminum and/or copper, silicon carbide (SiC), heavily doped, e.g., co-doped polycrystalline silicon, aluminum oxide, aluminum nitride or a material embedding carbon nanotubes. The heat sink features 325 lead off thermal energy directly from where thermal energy is generated in the semiconductor body 100 in case of an overcurrent condition or an avalanche breakdown. The heat sink features 325 improve thermal resilience of the semiconductor device 500 at low adverse impact on further device parameters.

The transistor cells TC may be planar transistor cells with gate electrodes formed on the first surface 101 and outside of the semiconductor body 100.

Figure 6B:
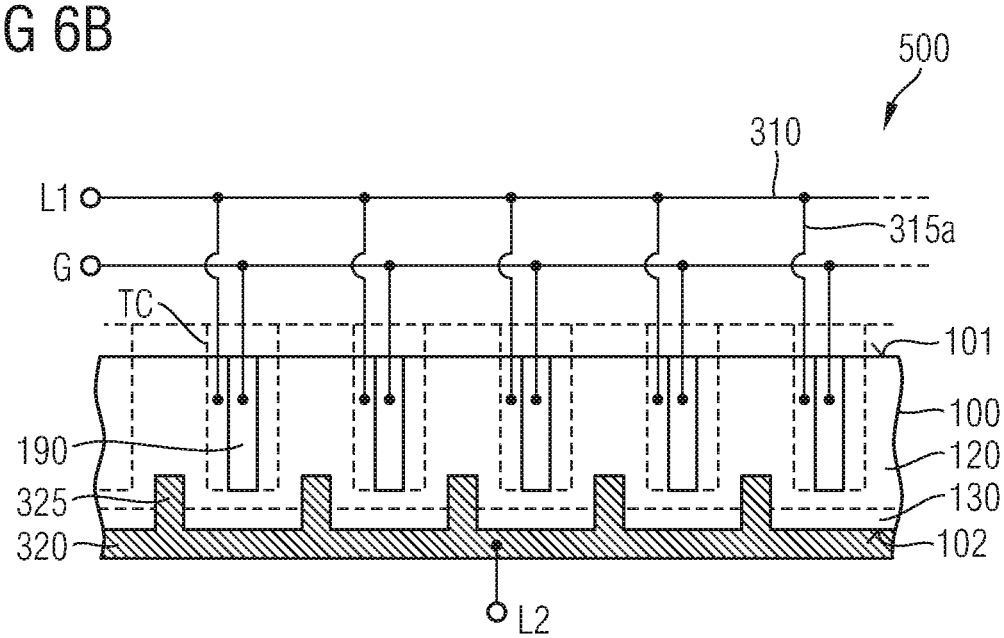
FIG. 6B is a schematic vertical cross-sectional view of a portion of a semiconductor device releasing thermal energy through heat sink features at a rear side according to an embodiment referring to trench gate structures.

FIG. 6B refers to a semiconductor device 500 with trench structures 190 that include gate structures and that extend from the first surface 101 into the semiconductor body 100. Semiconducting portions of the transistor cells TC are formed in portions of the semiconductor body 100 directly adjoining to the trench structures 190. The heat sink features 325 may be formed outside of a—with respect to the first surface 101—vertical projection of the transistor cells TC and may be formed at a lateral distance to the transistor cells TC.

Heat sink features 325 may be formed between each pair of neighboring trench structures 190 or in selected regions of the semiconductor body 100, wherein in regions outside of the selected regions the transistor cells TC may directly adjoin to each other.

The second load electrode 320 and the heat sink features 325 may include the same materials and may have the same material configuration or may be based on different materials and/or different material combinations.

Figure 7B:
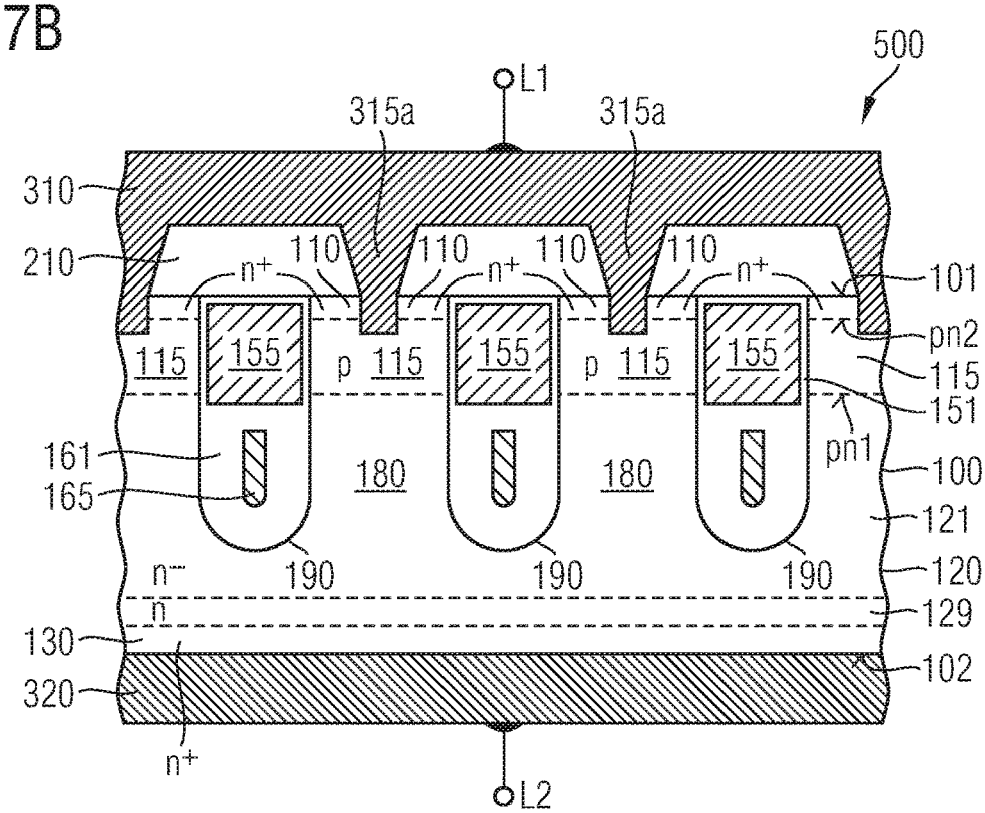
FIG. 7B is a schematic vertical cross-sectional view of the semiconductor device portion of FIG. 7A along line B-B.
Figure 7C:
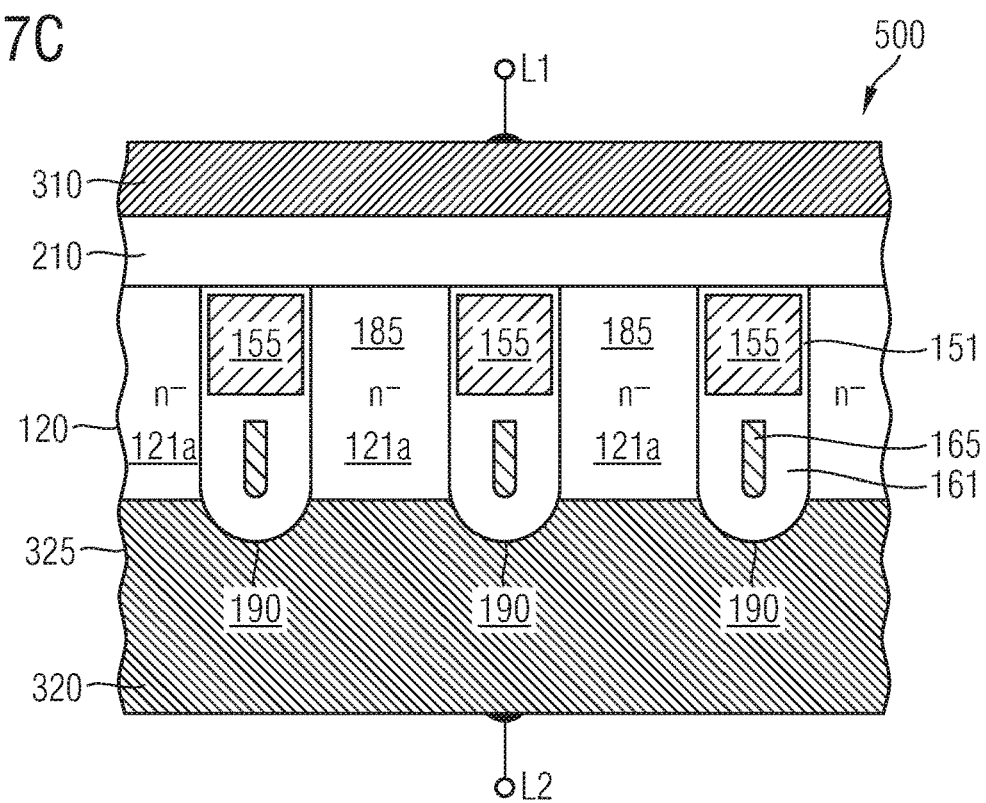
FIG. 7C is a schematic vertical cross-sectional view of the semiconductor device portion of FIG. 7A along line C-C.

FIGS. 7A to 7C refer to an embodiment with equally spaced stripe-shaped heat sink features 325 extending from the rear side into a semiconductor body 100 of a semiconductor device 500, which may be an MGT, an IGFET, or an IGBT by way of example. The semiconductor body 100 is based on a crystalline semiconductor material, e.g., Si, Ge, SiGe or an $A_{III}B_V$ semiconductor. At a front side the semiconductor body 100 has a first surface 101 which may be defined by a plane spanned by coplanar top surfaces of mesas 180 formed from sections of the semiconductor body 100 between neighboring trench structures 190. A planar second surface 102 at the opposite rear side is parallel to the first surface 101. Directions parallel to the first surface 101 are horizontal directions and a direction perpendicular to the first surface 101 is a vertical direction.

A minimum distance between the first and second surfaces 101, 102 is selected to achieve a specified voltage blocking capability of the semiconductor device 500 and may be at least 15 µm. For example, the distance between the first and second surfaces 101, 102 may be in a range from 20 µm to 60 µm.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are horizontal directions.

In the semiconductor body 100 a pedestal layer 130 is sandwiched between a drift structure 120 and the second surface 102. The pedestal layer 130 may have the same conductivity type as the drift structure 120, a complementary conductivity type, or may include zones of both conductivity types. In the pedestal layer 130 a dopant concentration along the second surface 102 is sufficiently high to form an ohmic contact with a metal layer formed in direct contact with the second surface 102.

The drift structure 120 may include a lightly doped drift zone 121 and a more heavily doped buffer or field stop zone 129 sandwiched between the drift zone 121 and the pedestal layer 130. A dopant concentration in the drift zone 121 may gradually or in steps increase or decrease with increasing distance to the first surface 101 at least in portions of its vertical extension. According to other embodiments the dopant concentration in the drift zone 121 may be approximately uniform. A mean dopant concentration in the drift zone 121 may be between $1E12$ $cm^{-3}$ and $1E17$ $cm^{-3}$, for example in a range from $5E12$ $cm^{-3}$ to $5E16$ $cm^{-3}$. A mean dopant concentration in the buffer or field stop zone 129 is at least three times, for example at least five times as high as the mean dopant concentration in the drift zone 121.

Trench structures 190 extend from the first surface 101 into the semiconductor body 100. A vertical extension of the trench structures 190 may range from 300 nm to 15 µm, e.g., from 1 µm to 10 µm. A lateral width of the mesas 180 may range from 0.05 µm to 10 µm, e.g., from 0.15 µm to 2 µm. The trench structures 190 may have the same vertical extension or may have different vertical extensions.

The trench structures 190 may include at least gate structures 150 that include a conductive gate electrode 155 and a gate dielectric 151 separating the gate electrode 155 from the semiconductor body 100. The gate electrode 155 may be a homogeneous structure or may have a layered structure including one or more metal containing layers. According to an embodiment, the gate electrode 155 may include or consist of a heavily doped polycrystalline silicon layer.

The gate dielectric 151 may include or consist of a semiconductor oxide, e.g., a thermally grown or deposited silicon oxide, a semiconductor nitride, e.g., deposited or thermally grown silicon nitride, a semiconductor oxynitride, e.g., silicon oxynitride, by way of example.

The trench structures 190 may further include field plate structures 160 between the gate structures 150 and a bottom of the trench structures 190. The field plate structures 160 include a conductive field plate 165 and a field dielectric 161 separating the field plate 165 from the semiconductor body 100. The field plate 165 may be a homogeneous structure or may be a layered structure including one or more metal containing layers. According to an embodiment the field plate 165 may include or consist of a heavily doped polycrystalline silicon layer. Materials and internal configuration of the gate electrode 155 and the field plate 165 may be the same. The field plate 165 may be electrically connected to one of the load electrodes of the semiconductor device 500, with the gate electrode 155 or with a field plate terminal electrically separated from the load terminals and the gate terminal.

The field dielectric 151 may include or consist of a semiconductor oxide, e.g., a thermally grown or deposited silicon oxide, a semiconductor nitride, e.g., a deposited or thermally grown silicon nitride, a semiconductor oxynitride, e.g., a silicon oxynitride, by way of example. Materials and internal configuration of the field dielectric 161 and the gate dielectric 151 may be the same.

Semiconducting portions of transistor cells TC are formed in the mesas 180 that separate the trench structures 190 from each other. The mesas 180 include body zones 115 and source zones 110, wherein the body zones 115 form first pn junctions pn1 with the drift structure 120 and second pn junctions pn2 with the source zones 110.

An interlayer dielectric 210 may be formed on the first surface 101. The interlayer dielectric 210 may include one or more layers of semiconductor oxide, e.g., silicon oxide, semiconductor nitride, e.g., silicon nitride, or semiconductor oxynitride, e.g., silicon oxynitride, which may be layers thermally grown on or deposited on the semiconductor body 100, and/or one or more layers of doped or undoped glass, e.g., BSG (boron silicate glass), PSG (phosphorus silicate glass), BPSG (boron phosphorus silicate glass), FSG (fluorosilicate glass), USG (undoped silicate glass) or a spin-on glass.

A first load electrode 310 is formed on the interlayer dielectric 210 such that the interlayer dielectric 210 is sandwiched between the first load electrode 310 and the semiconductor body 100. The first load electrode 310 may form or may be electrically coupled or connected to a first load terminal L1, which may be an emitter terminal of an IGBT, a source terminal of an FET or an anode terminal of a power semiconductor diode, by way of example.

Source contact structures 315a extend from the first load electrode 310 through the interlayer dielectric 210 to or into the semiconductor body 100 and electrically connect the source zones 110 and the body zones 115 in the mesas 180 with the first load electrode 310.

A second load electrode 320 directly adjoining the pedestal layer 130 and the second surface 102 may form or may be electrically coupled or connected to a second load terminal L2, which may be a collector terminal of an IGBT, a drain terminal of an FET or a cathode terminal of a power semiconductor diode, by way of example.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

Stripe-shaped heat sink features 325 extend from the rear side into the semiconductor body 100. The heat sink features 325 may be dielectric or low-conductive structures that may be homogeneous or layered, wherein dielectric or low-conductive portions may separate a highly electric conductive portion from the semiconductor body 100. At least one of the materials of the heat sink features 325 may have a significant higher specific thermal capacity than the semiconductor body 100. For example, the heat sink features 325 may contain an electrically non-conductive PCM (phase change material), which may directly adjoin to the semiconductor body 100 and which may embed thermally high-conductive inclusions such as carbon nanotubes, diamond particles and/or graphene particles. For example, the heat sink features 325 may have any of the configurations described with reference to the heat sink structures 170 of FIGS. 3A to 3I.

According to another embodiment, the heat sink features 325 may include or consist of an electrically conductive portion, wherein the heat sink features 325 include a material with a higher thermal conductivity than the semiconductor body 100. For example, the material of the heat sink features 325 may be or may include silicon carbide, aluminum oxide, aluminum nitride or a material embedding carbon nanotubes. According to an embodiment, the material of the heat sink features 325 is heavily p-doped, n-doped or co-doped polycrystalline silicon with a dopant concentration greater $2E19$ $cm^{-3}$, e.g., greater than $3E19$ $cm^{-3}$ or greater $6E19$ $cm^{-3}$. The material of the heat sink features 325 may directly adjoin to the semiconductor body 100 or may be at least partially insulated against the semiconductor body 100, e.g., by a dielectric portion with high thermal conductivity.

In the illustrated embodiment, all heat sink features 325 have the same vertical extension. According to other embodiments, the vertical extension of the heat sink features 325 may locally vary. The vertical extension of the heat sink features 325 may be selected such that the heat sink features 325 do not overlap with the trench structures 190 along the vertical axis. In the illustrated embodiment, the heat sink features 325 overlap with the trench structures 190 and directly adjoin to the field plate structures 160 in the trench structures 190.

The embodiment of FIGS. 7A to 7C refer to heat sink features 325 completely formed from an electrically conductive material that directly adjoins to portions of the drift zone 121 in the semiconductor body 100.

As illustrated in FIG. 7A, sub-regions including transistor cells TC and sub-regions for cooling may alternate along a horizontal direction orthogonal to a longitudinal axis of the stripe-shaped trench structures 190.

Idle mesa sections 185 in the vertical projection of the heat sink features 325 may include an auxiliary portion 121a of the drift zone 121 directly adjoining to the first surface 101, Portions of the body zone 115 or an insulating structure may separate the auxiliary portions 121a of the drift zone 121 from neighboring source zones 110 in the horizontal direction.

For example, for semiconductor devices 100 with a blocking voltage in a range from 20 V to 60 V a distance between neighboring heat sink features 325 or between heat sink features 325 and neighboring body zones 115 may be in a range from 1 μm to 4 μm. Distribution, dimensions and materials of the heat sink features 325 may be selected to locally compensate wafer bowing to some degree or to locally improve charge carrier mobility.

Figure 8A:
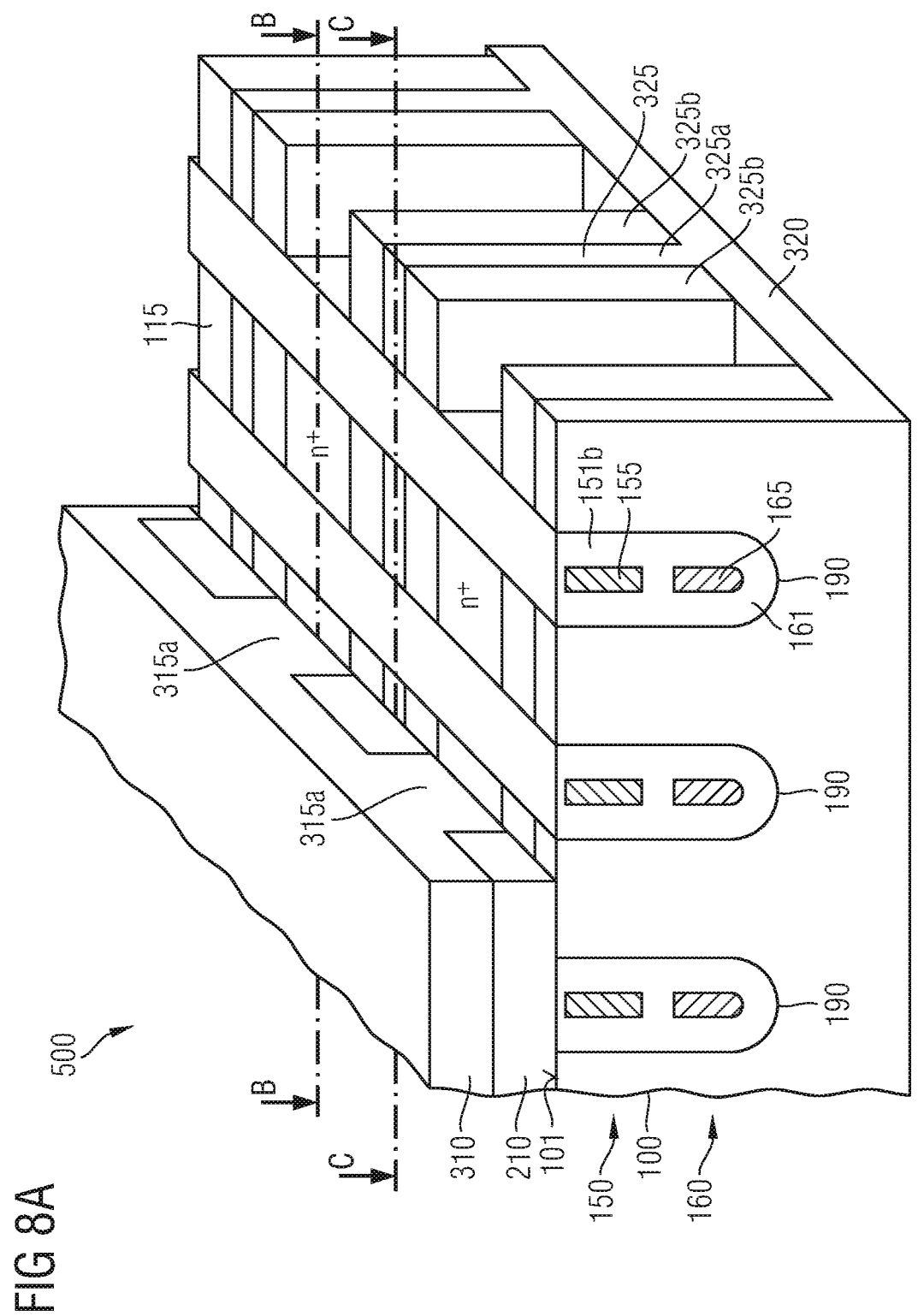
FIG. 8A is a schematic perspective view of a portion of a semiconductor device according to an embodiment with stripe-shaped heat sink features connected to a load electrode at a rear side and extending up to a front side.
Figure 8B:
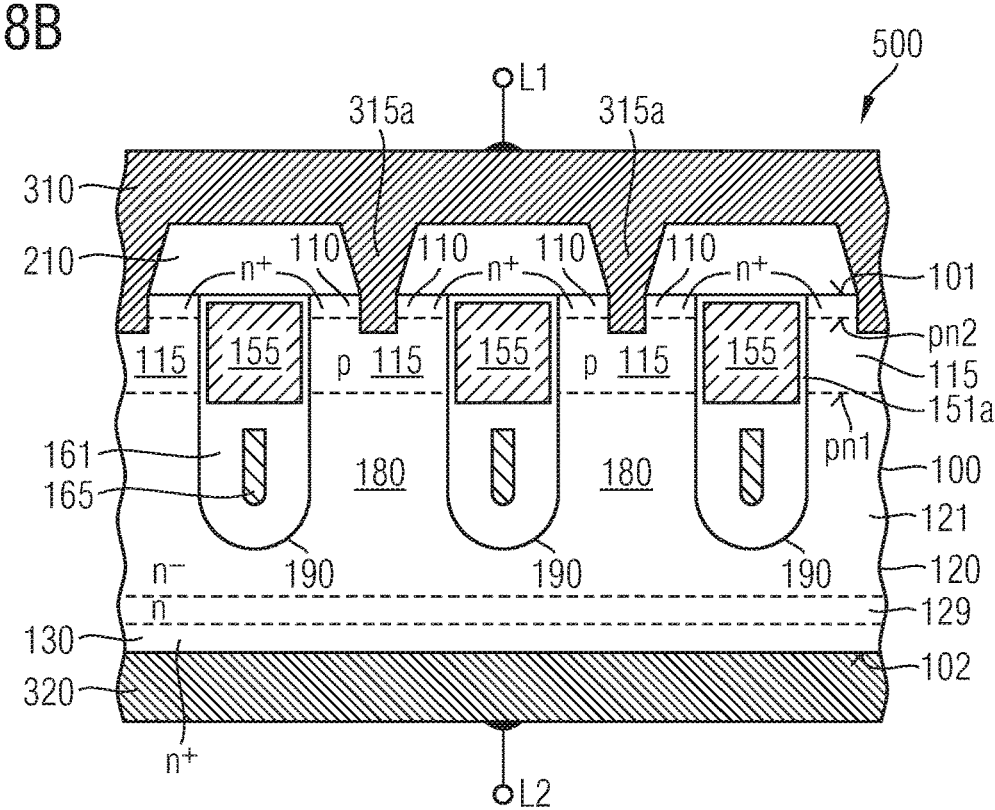
FIG. 8B is a schematic vertical cross-sectional view of the semiconductor device portion of FIG. 8A along line B-B.
Figure 8C:
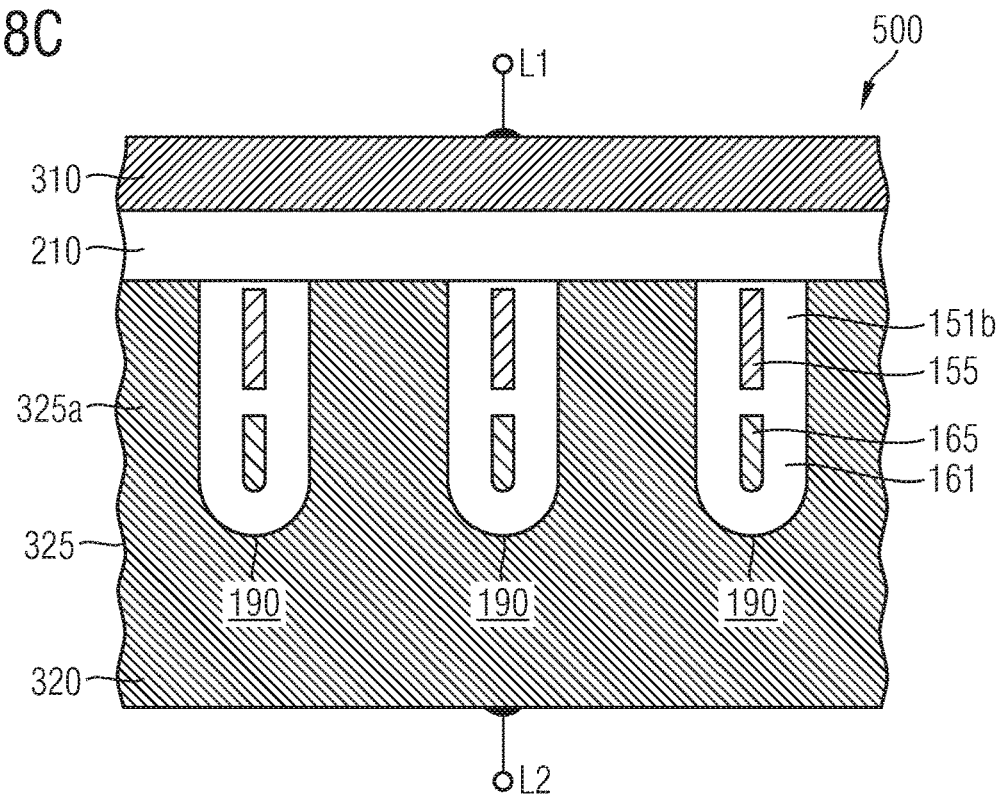
FIG. 8C is a schematic vertical cross-sectional view of the semiconductor device portion of FIG. 8A along line C-C.

The embodiment of FIGS. 8A to 8C refers to heat sink features 325 extending from the second surface 102 up to the first surface 101. The heat sink features 325 may include an electrically conductive portion 325a and a dielectric portion 325b electrically separating the electrically conductive portion 325a horizontally from at least sections of the semiconducting portions of the transistor cells TC, e.g., from the source zones 110 and the body zones 115 and the first pn junction pn1. The material of the dielectric portion 325b may have a higher thermal conductivity than silicon oxide. According to an embodiment, the dielectric portion 325b has a a specific thermal conductivity of at least twice the specific thermal conductivity of the gate dielectric 151, which may be formed from silicon oxide.

The gate dielectric 151 may include first portions 151a electrically separating the gate electrode 155 from the body zones 115 and second portions 151b electrically separating the gate electrode 155 from the heat sink features 325. The second portions 151b of the gate dielectric 151 are significantly thicker than the first portions 151a. A thickness of the second portions 151b may be approximately the same as a thickness of the field dielectric 161, For further details reference is made to the description of FIGS. 7A to 7C.

Figure 9A:
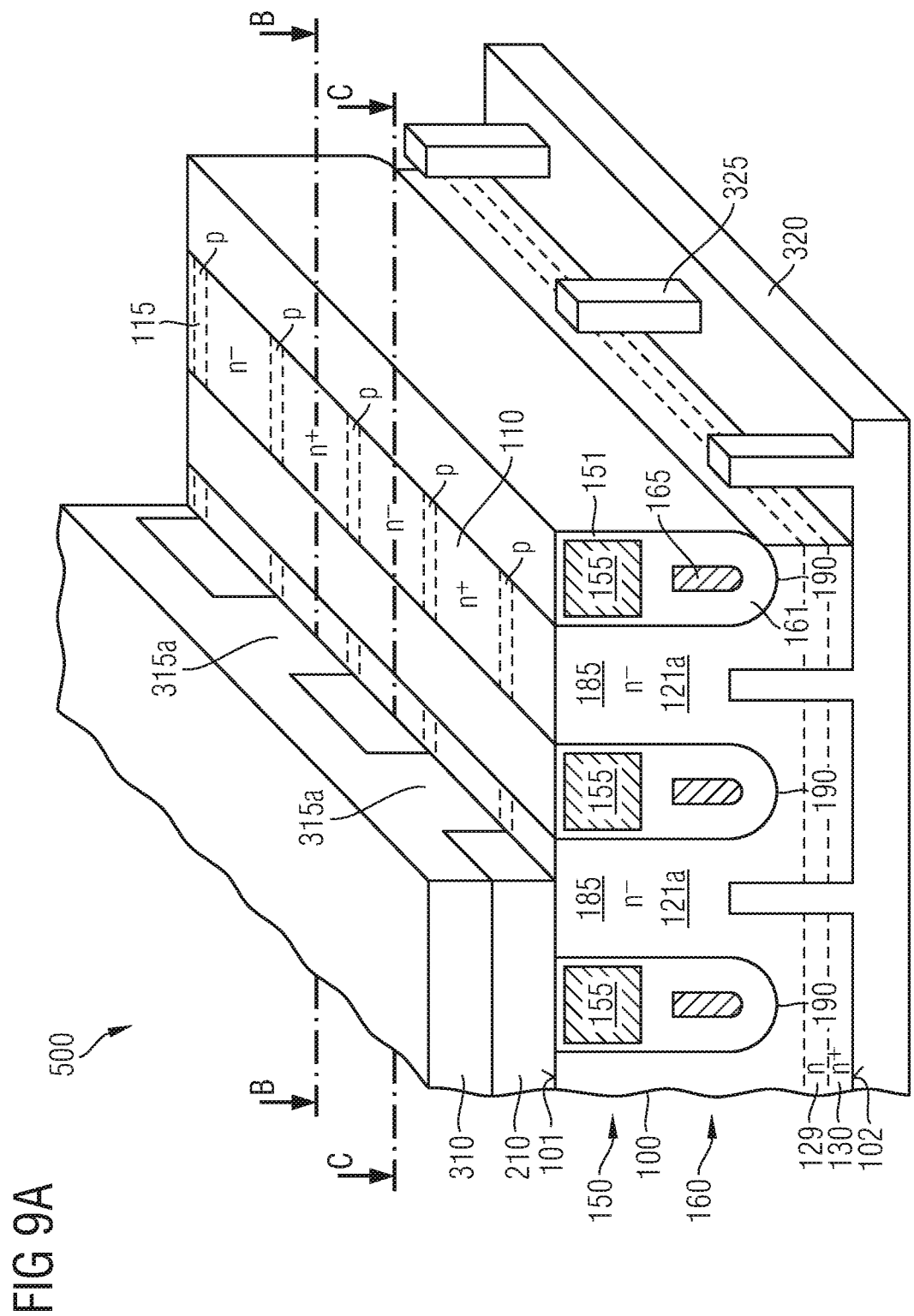
FIG. 9A is a schematic perspective view of a portion of a semiconductor device according to an embodiment with column-like heat sink features connected to a load electrode at a rear side.
Figure 9B:
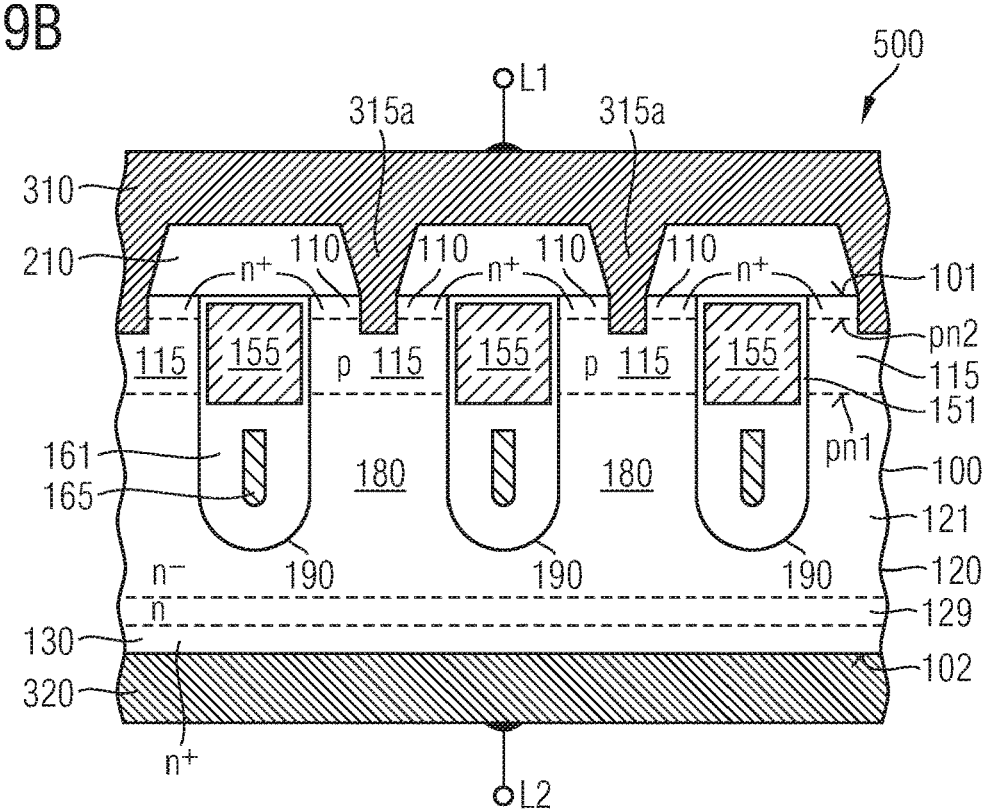
FIG. 9B is a schematic vertical cross-sectional view of the semiconductor device portion of FIG. 9A along line B-B.
Figure 9C:
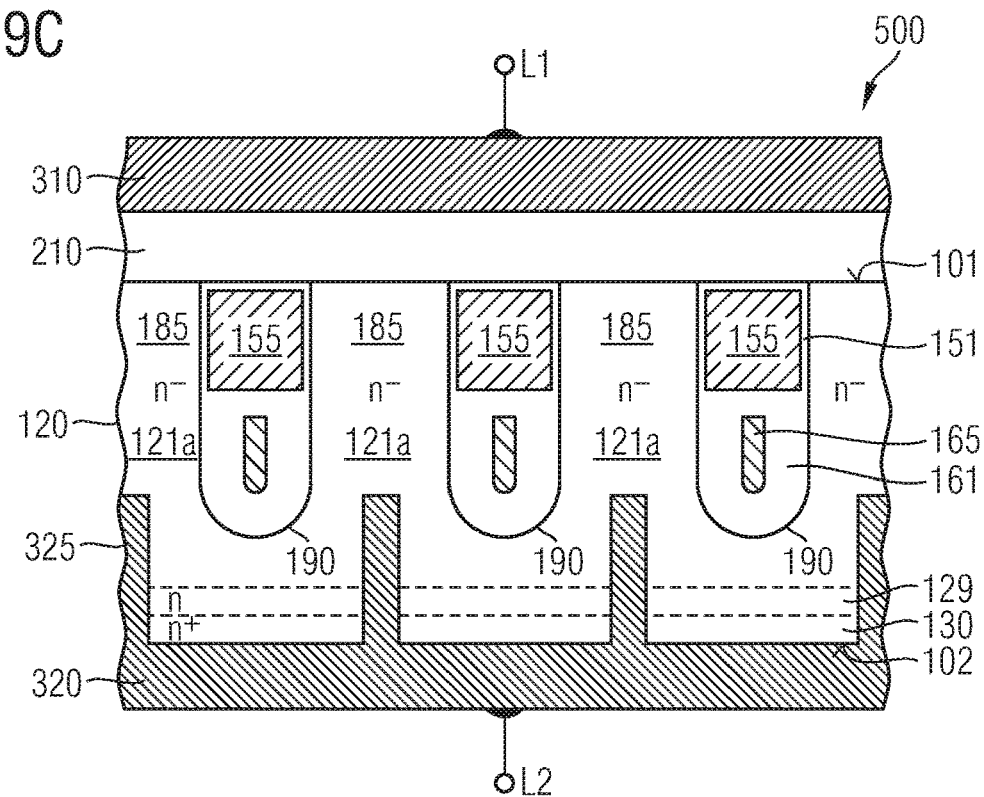
FIG. 9C is a schematic vertical cross-sectional view of the semiconductor device portion of FIG. 9A along line C-C.

In FIGS. 9A to 9C the semiconductor device 500 includes column-like heat sink features 325 arranged in orthogonal lines and rows. The heat sink features 325 may be horizontally spaced from a vertical projection of the trench structures 190, For further details reference is made to the description of FIGS. 7A to 7C.

Figure 10A:
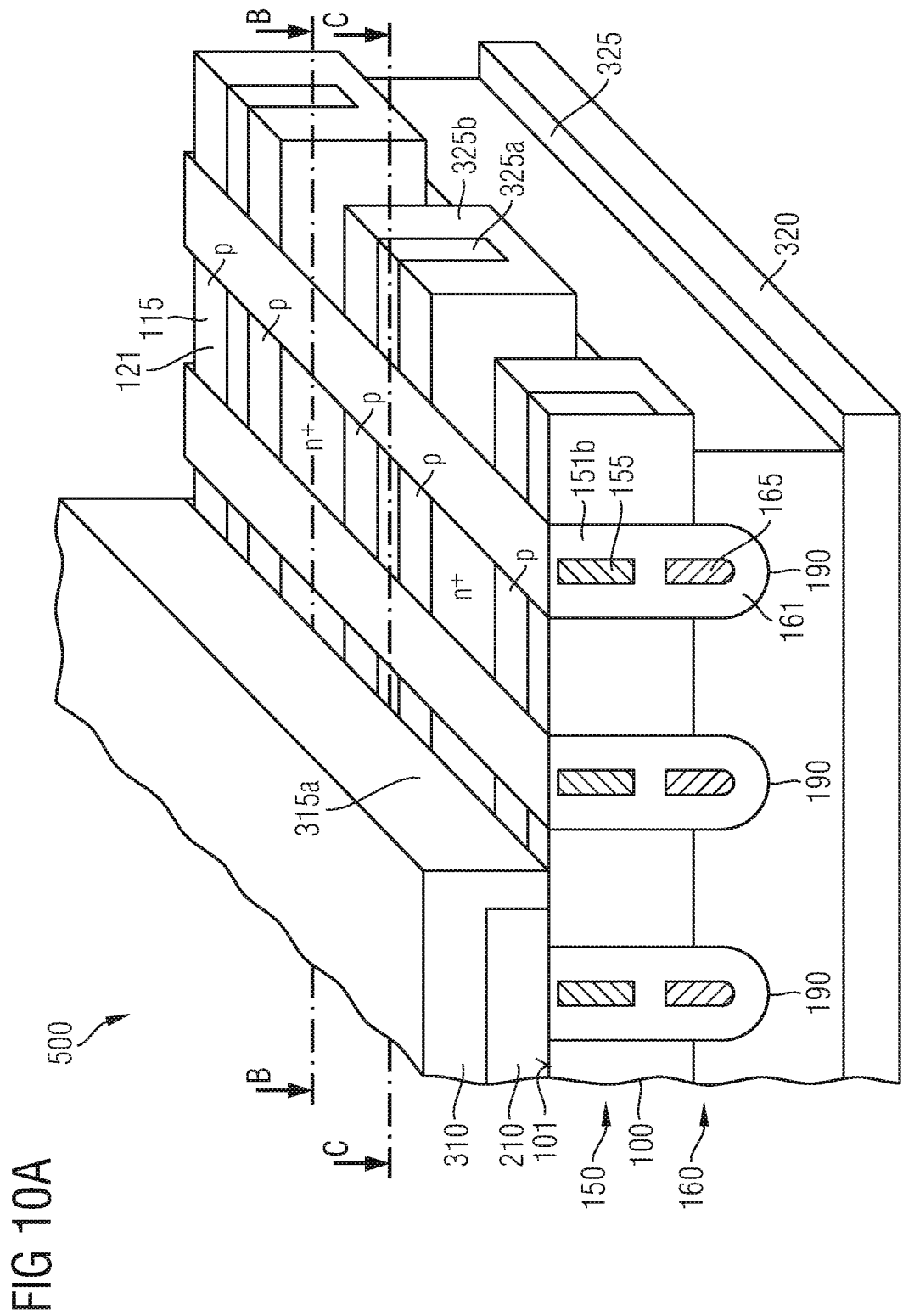
FIG. 10A is a schematic perspective view of a portion of a semiconductor device according to an embodiment with stripe-shaped heat sink features formed at a front side.

The semiconductor device 500 in FIGS. 10A to 100 includes stripe-shaped heat sink features 325 extending from the front side into the drift structure 120 and including a dielectric portion 325b electrically separating an electrically conductive portion 325a horizontally from at least sections of the body zones 115 close to the first pn junctions pn1 and from portions of the drift structure 120.

The conductive portions 325a or the complete heat sink features 325 are separated from the second load electrode 320. Instead, the heat sink features 325 may be thermally and electrically connected with the first load electrode 310 or with another metal structure at the front side.

According to another embodiment, the heat sink structures 325 may have higher thermal capacity than the semiconductor body 100, wherein the heat sink structures 325 may be non-conductive or may include conductive portions without electrical connection to any of the load electrodes 310, 320 of the semiconductor device 500.

According to an embodiment the front side heat sink features 325 may have any of the configurations described with reference to the heat sink structures 170 of FIGS. 3A to 3I. For example, the heat sink features 325 may contain an electrically non-conductive PCM, which may directly adjoin to the semiconductor body 100 and which may embed thermally high-conductive inclusions such as carbon nanotubes, diamond particles and/or graphene particles.

Heat sink features 325 formed at the front side as described with reference to FIGS. 10A to 10C may be combined with heat sink features 325 at the rear side as described with reference to FIGS. 7A to 7C and FIGS. 9A to 9C, wherein the front side and rear side heat sink structures may be formed as comb-like structures shifted to each other such that teeth of one comb-like structure are adjusted to gaps in the other comb-like structure and vice versa.

The arrangement of both front side heat sink structures and rear side heat sink features 325 may be regular such that a population density of the heat sink features 325 is constant across a complete horizontal cross-sectional area of the semiconductor body 100.

Figure 11A:
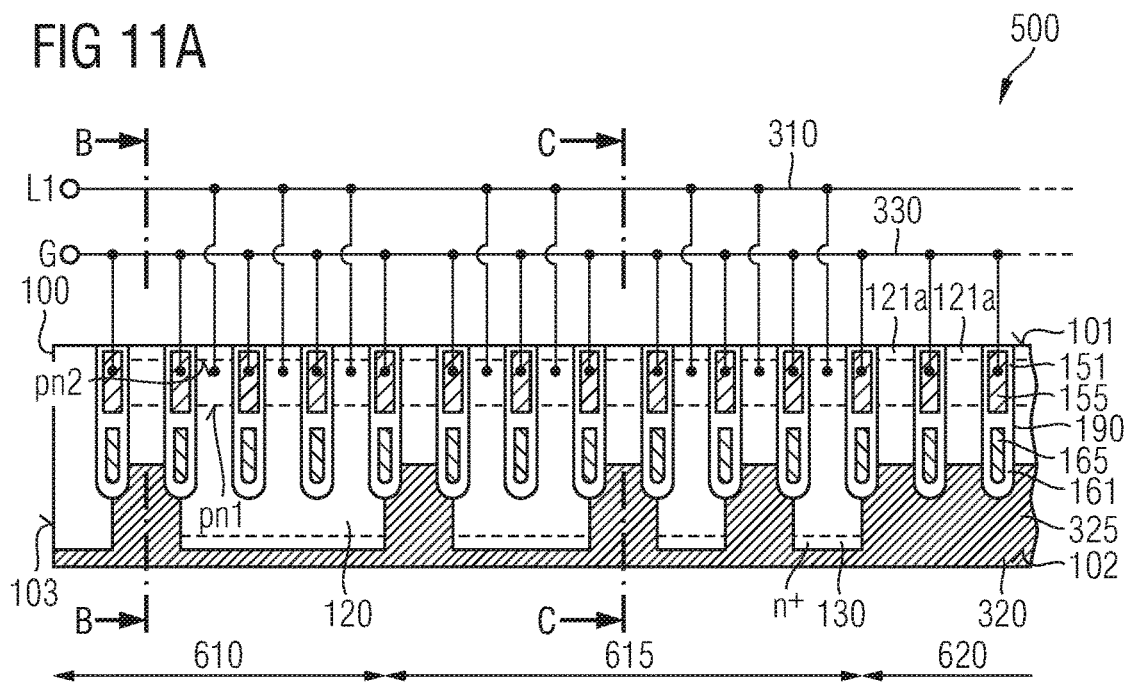
FIG. 11A is a schematic cross-sectional view of a portion of a semiconductor device according to an embodiment with not-evenly distributed heat sink features.
Figure 11B:
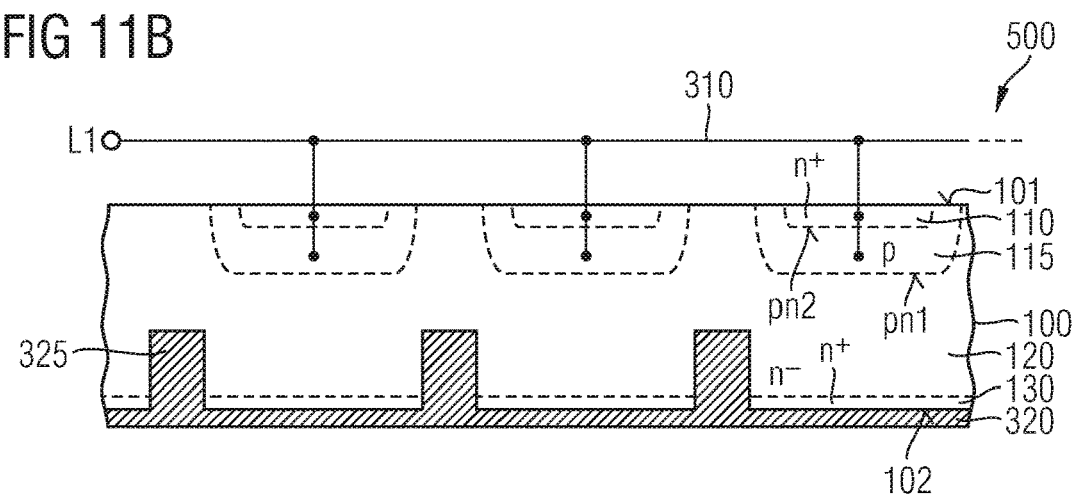
FIG. 11B is a schematic vertical cross-sectional view of the semiconductor device portion of FIG. 11A along line B-B.
Figure 11C:
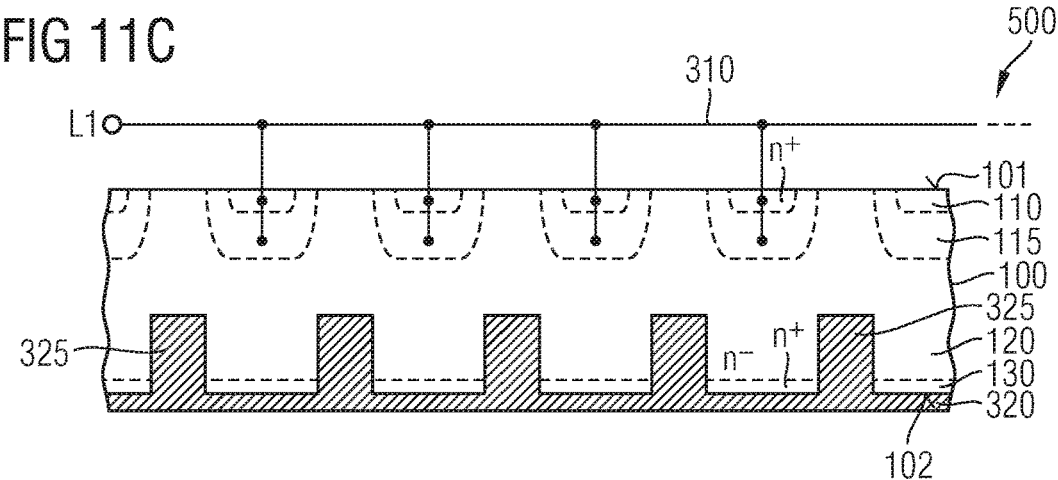
FIG. 11C is a schematic vertical cross-sectional view of the semiconductor device portion of FIG. 11A along line C-C.

According to the embodiment of FIGS. 11A to 11C, the distribution of heat sink features 325 is adapted to an assumed thermal distribution in the semiconductor body 100 without heat sink features 325. For example, in the absence of any heat sink features 325 in first sections 610 of the semiconductor body 100 along edges of a transistor cell area close to a lateral outer surface 103 of the semiconductor body 100 or below bond wires, a temperature of the semiconductor body 100 is lower than in second sections 620 including central portions of the transistor cell area in a distance to the bond wires. Then a population density of the heat sink features 325 in the second sections 620 is higher than in the first sections 610 to promote a better cooling of the hotter second sections with reference to the cooler first sections and to achieve a more uniform temperature distribution in the semiconductor body 100.

The population density of the heat sink features 325 may gradually increase from the first sections 610 to the second sections in transition sections 615 between the first and second sections 610, 620. According to an embodiment, the heat sink features 325 have a lateral dimension of about 1 μm and are arranged at a distance of 4 μm to each other in the second sections and at a distance of 10 μm to each other in the first sections, wherein in the transition section 615 between the first and second sections 610, 620 the distance may gradually increase from 4 μm to 10 μm. For further details reference is made to the description of the previous Figures.

A method of manufacturing a semiconductor device with gate electrodes formed in trench structures extending from a front side into a semiconductor body and with heat sink features extending from a rear side into the semiconductor body may include the formation of front side trenches of different vertical extension at the front side of the semiconductor body.

The semiconductor body may be thinned from the rear side to a bottom edge of the deepest front side trenches. A lithography process may define a hard mask on the rear side of the thinned semiconductor body for defining the heat sink features. Using the hard mask, rear side trenches are etched into the semiconductor body. Then materials for the heat sink features may be deposited, e.g., a diffusion barrier for copper atoms. The diffusion barrier may include at least one of a tantalum layer, a tantalum nitride layer, a titanium layer, a titanium nitride layer and a tungsten-containing layer. Then a fill material, e.g., copper Cu or tungsten W may be deposited to fill the rear side trenches.

According to an embodiment, a thin thermal oxide with a thickness of about 2 nm to 5 nm may be formed before deposition of the diffusion barrier or in the alternative to deposition of the diffusion barrier in order to improve the interface quality between the semiconductor body and the heat sink structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a drift structure formed in a semiconductor body, the drift structure forming first pn junctions with body zones of transistor cells;
gate structures extending from a first surface of the semiconductor body into the drift structure; and
heat sink structures extending from the first surface into the drift structure, wherein a thermal capacity of the heat sink structures is greater than a thermal capacity of the gate structures,
wherein the heat sink features are electrically non-conductive or include an electrically conductive portion without electric connection.

2. The semiconductor device of claim 1, wherein
a vertical extension of the heat sink structures is equal to or deviates by not more than 20% from a vertical extension of the gate structures.

3. The semiconductor device of claim 1, wherein
the heat sink structures and the gate structures form a regular stripe pattern with a same center-to-center distance between neighboring ones of the gate structures, between neighboring ones of the heat sink structures, and between neighboring gate and heat sink structures.

4. The semiconductor device of claim 3, wherein
portions of the semiconductor body form (i) active mesas comprising the body zones and directly adjoining to the gate structures and (ii) idle mesas between neighboring ones of the heat sink structures.

5. The semiconductor device of claim 1, further comprising:
field plate structures extending from the first surface into the drift structure.

6. The semiconductor device of claim 1, wherein the heat sink structures comprise a dielectric portion with a specific thermal conductivity exceeding at least twice a specific thermal conductivity of a gate dielectric comprised in the gate structures.

7. The semiconductor device of claim 1, wherein the heat sink structures comprise a dielectric portion thinner than a gate dielectric comprised in the gate structure.

8. The semiconductor device of claim 1, wherein the heat sink structures comprise an electrically conductive central portion and a dielectric portion separating the conductive portion and the semiconductor body.

9. The semiconductor device of claim 1, wherein the heat sink structures comprise a material with a specific thermal capacitance exceeding at least twice a specific thermal capacitance of a gate electrode comprised in the gate structures.

10. The semiconductor device of claim 1, wherein the heat sink structures comprise a phase change material.

11. The semiconductor device of claim 1, wherein the heat sink structures comprise a gap or air pockets.

12. The semiconductor device of claim 1, wherein the heat sink structures comprise thermally high-conductive structures at an interface to the semiconductor body.

13. The semiconductor device of claim 12, wherein the thermally high-conductive structures comprise at least one of diamond crystallites, carbon nanotubes and graphene flakes.

14. The semiconductor device of claim 12, wherein the heat sink structures comprise a heat sink fill containing at least one of boron nitride and aluminum nitride.

15. The semiconductor device of claim 1, wherein the heat sink structures comprise a high-conductive central portion electrically separated from a gate electrode comprised in the gate structure.

16. The semiconductor device of claim 1, wherein the heat sink structures are configured as field plate structures.

17. The semiconductor device of claim 1, further comprising:
a source contact structure extending from the first surface into the body zone wherein at least one of (i) a thermal conductivity of the heat sink structure is greater than a thermal conductivity of the source contact structure; and (ii) a thermal capacity of the heat sink structure is greater than a thermal capacity of the source contact structure.

18. The semiconductor device of claim 1, wherein the heat sink structures are insulated from the body zone.

19. The semiconductor device of claim 1, wherein the gate structures are stripe-shaped with a first horizontal extension exceeding at least ten times a second horizontal extension orthogonal to the first horizontal extension.

20. The semiconductor device of claim 1, wherein the gate structures are dot-shaped with a first horizontal extension and a second horizontal extension orthogonal to the first horizontal extension within the same order of magnitude.

21. The semiconductor device of claim 1, wherein the heat sink structures are stripe-shaped with a first horizontal extension exceeding at least ten times a second horizontal extension orthogonal to the first horizontal extension.

22. The semiconductor device of claim 1, wherein the heat sink structures are dot-shaped with a first horizontal extension and a second horizontal extension orthogonal to the first horizontal extension within the same order of magnitude.

23. The semiconductor device of claim 1, further comprising:
a first electrically conductive load electrode disposed on the first surface of the semiconductor body;
a second electrically conductive load electrode disposed on a second surface of the semiconductor body, the second surface being opposite the first surface,
wherein the gate structures are configured to control an electrically conductive connection between the first and second load electrodes, and
wherein the heat sink features are electrically disconnected from the first and second load electrodes.

* * * * *